United States Patent
Wang et al.

(10) Patent No.: US 8,380,472 B2
(45) Date of Patent: Feb. 19, 2013

(54) SEMICONDUCTOR YIELD MANAGEMENT SYSTEM AND METHOD

(75) Inventors: Weidong Wang, Union City, CA (US); Jonathan B. Buckheit, Los Altos, CA (US)

(73) Assignee: Rudolph Technologies, Inc., Flanders, NJ (US)

( * ) Notice: Subject to any disclaimer, the term of this patent is extended or adjusted under 35 U.S.C. 154(b) by 743 days.

(21) Appl. No.: 12/150,676

(22) Filed: Apr. 29, 2008

(65) Prior Publication Data

US 2008/0281566 A1 Nov. 13, 2008

Related U.S. Application Data

(63) Continuation of application No. 10/977,383, filed on Oct. 28, 2004, now abandoned.

(51) Int. Cl.
*G06G 7/48* (2006.01)
(52) U.S. Cl. ............... 703/7; 700/121; 703/22
(58) Field of Classification Search .......... 703/22, 703/7; 700/121
See application file for complete search history.

(56) References Cited

U.S. PATENT DOCUMENTS

| | | | | |
|---|---|---|---|---|
| 4,754,410 | A | 6/1988 | Leech et al. | 364/513 |
| 5,897,627 | A | 4/1999 | Leivian et al. | 706/12 |
| 6,098,063 | A | 8/2000 | Xie et al. | 706/60 |
| 6,336,086 | B1 | 1/2002 | Perez et al. | 703/13 |
| 6,470,229 | B1 | 10/2002 | Wang et al. | 700/121 |

OTHER PUBLICATIONS

Chou et al. "A Resource Portfolio Planning Methodology for Semiconductor Wafer Manufacturing" 2001.*

Kao et al. "A Tool Portfolio Planning Methodology for Semiconductor Wafer Fabs" IEEE 2000.*

Pierce et al. "Cycle Time Metrics for R&D Semiconductor Wafer Fabrication" 1995 IEEE.*

Bergendahl, et al., "Optimization of Plasma Processing for Silicon-Gate FET Manufacturing Applications," *IBM. J. Res. Develop.*, 26(5):pp. 580-589 (Sep. 1982).

Chou et al., "A Resource Portfolio Planning Methodology for Semiconductor Wafer Manufacturing," *The International Journal of Advanced Manufacturing Technology*, 18:12-19 (2001).

"Data Mining and the Case for Sampling: Solving Business Problems Using SAS® Enterprise Miner™ Software," *A SAS Institute Best Practices Paper*, SAS Institute Inc., Cary, North Carolina, pp. 1-36 (1998).

Freidhoff, et al., "Analysis of Intra-Level Isolation Test Structure Data by Multiple Regression to Facilitate Rule Identification for Diagnostic Expert Systems" *Proc. IEEE*, Int. Conf. Micro. Test Struc., 2(1):pp. 217-221 (Mar. 1989).

Ison et al., "Fault Diagnosis of Plasma Etch Equipment," *Semiconductor Manufacturing Conference Proceedings, 1997 IEEE International Symposium*, San Francisco, CA., pp. B49-B52 (Oct. 6-8, 1997).

Irani et al., "Applying Machine Learning to Semiconductor Manufacturing," *Expert, IEEE*, 8(1):pp. 41-47 (Feb. 1993).

(Continued)

*Primary Examiner* — Saif Alhija
(74) *Attorney, Agent, or Firm* — Harrington & Smith

(57) ABSTRACT

A system and method for yield management are disclosed wherein a data set containing one or more prediction variable values and one or more response variable values is input into the system. The system can process the input data set to remove prediction variables with missing values and data sets with missing values based on a tiered splitting method to maximize usage of all valid data points. The processed data can then be used to generate a model that may be a decision tree. The system can accept user input to modify the generated model. Once the model is complete, one or more statistical analysis tools can be used to analyze the data and generate a list of the key yield factors for the particular data set.

20 Claims, 24 Drawing Sheets

OTHER PUBLICATIONS

Kao et al., "A Tool Portfolio Planning Methodology for Semiconductor Wafer Fabs," *IEEE*, 84-90 (2000).

Murthy "Automatic Construction of Decision Trees from Data: A Multi-Disciplinary Survey," *Data Mining and Knowledge Discovery*, Kluwer Academic Publishers, Boston, 2:pp. 345-389 (1998).

Lee, et al., "RTSPC: A Software Utility for Real-Time SPC and Tool Data Analysis" *IEEE Trans. Semicon. Mfg.*, 8(1):pp. 17-25 (Feb. 1995).

Lee, et al. "Yield Analysis and Data Management Using Yield Manager™," *IEEE/SEMI Advanced Semiconductor Manufacturing Conference and Workshop*, pp. 19-30, (Sep. 23-25, 1998).

Perez, et al. "Machine Learning for a Dynamic Manufacturing Environment," *ACM SIGICE Bulletin*, 19(3):pp. 5-9 (Feb. 1994).

Quinlan "Unknown Attribute Values In Induction," *Proceedings of the Sixth International Workshop on Machine Learning*, Ithaca, New York, Morgan Kaufmann Publishers Inc.; pp. 164-168 (1989).

Yang "EPAS: An Emitter Piloting Advisory Expert System for IC Emitter Deposition" *IEEE Trans. Semicon. Mfg.*, 3(2): pp. 45-53 (May 1990).

Genesis™ Quick Guide:, Yield Dynamics, Inc., rev. 1.0, Apr. 2001, 2 pgs.

"Yield Mine User Guide", Yield Dynamics, Aug. 2002, 42 pgs.

"Bitmap Analysis User Guide", Yield Dynamics, Jul. 2003, 102 pgs.

"FLEXTRACT 2.0.3 Programming Guide", Yield Dynamics, Jul. 2003, 208 pgs.

"Genesis Scripting Programming Guide", Yield Dynamics, Jul. 2003, 214 pgs.

\* cited by examiner

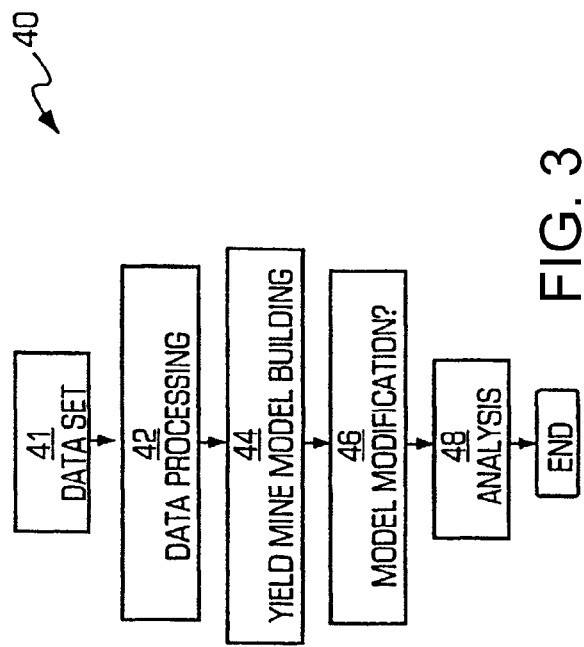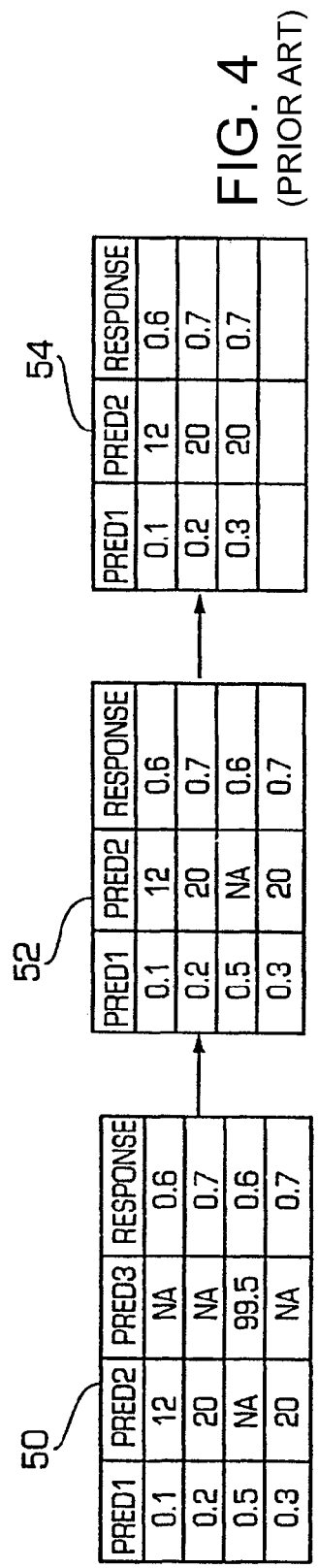

Case    Data    Set    /56

|  | $P_1$ | $P_2$ | $P_3$ | Response |
|---|---|---|---|---|
| 1 | 1 | 1 | 1 | Good |
| 2 | 1 | X | 2 | Good |
| 3 | 1 | 1 | 1 | Good |
| 4 | X | 2 | 2 | Bad |
| 5 | 1 | 2 | X | Bad |
| 6 | 1 | 2 | 2 | Bad |
| 7 | 2 | X | 1 | Bad |
| 8 | 2 | 1 | 2 | Bad |
| 9 | X | 1 | 1 | Bad |
| 10 | 2 | 2 | X | Bad |
| 11 | 2 | X | 1 | Bad |
| 12 | 2 | X | 2 | Bad |
| 13 | 1 | X | 1 | Good |

X: missing data

Original algorithm

Clean data set before build model

Case    Cleaned Data    /58

|  | $P_1$ | $P_2$ | $P_3$ | Response |
|---|---|---|---|---|
| 1 | 1 | 1 | 1 | Good |
| 3 | 1 | 1 | 1 | Good |
| 6 | 1 | 2 | 2 | Bad |
| 8 | 2 | 1 | 2 | Bad |

Model

Split rate : $P_3$=1    /60

Yes / No

|  | $P_1$ | $P_2$ | $P_3$ | Response |
|---|---|---|---|---|
| 1 | 1 | 1 | 1 | Good |
| 3 | 1 | 1 | 1 | Good |

|  | $P_1$ | $P_2$ | $P_3$ | Response |
|---|---|---|---|---|
| 6 | 1 | 2 | 2 | Bad |
| 8 | 2 | 1 | 2 | Bad |

Data Set 76

| $P_1$ | $P_2$ | $P_3$ | Response |
|---|---|---|---|
| Etch 1 | Etch 1 | Etch 1 | 1.1 |
| Etch 1 | Etch 2 | Etch 1 | 1.6 |
| Etch 2 | Etch 2 | Etch 2 | 2.3 |
| Etch 2 | Etch 2 | Etch 1 | 0.9 |

Add tool usage parameters
(Etch 1 & Etch 2) 78

| $P_1$ | $P_2$ | $P_3$ | Etch 1 | Etch 2 | Response |
|---|---|---|---|---|---|
| Etch 1 | Etch 1 | Etch 1 | 3 | 0 | 1.1 |
| Etch 1 | Etch 2 | Etch 1 | 2 | 1 | 1.6 |
| Etch 2 | Etch 2 | Etch 2 | 0 | 3 | 2.3 |
| Etch 2 | Etch 2 | Etch 1 | 1 | 2 | 0.9 |

FIG. 10

SEMICONDUCTOR YIELD MANAGEMENT SYSTEM AND METHOD

CROSS-REFERENCE TO RELATED PATENT APPLICATION

This is a continuation of U.S. patent application Ser. No. 10/977,383 filed on Oct. 28, 2004 now abandoned in the names of Weidong Wang and Jonathan B. Buckheit for SEMICONDUCTON YIELD MANAGEMENT SYSTEM AND METHOD.

BACKGROUND OF THE INVENTION

1. Field of the Invention

The present invention relates generally to a system and method for managing a semiconductor manufacturing process and, more particularly, to a system and method for managing yield in a semiconductor fabrication process.

2. Description of the Prior Art

The semiconductor manufacturing industry is continually evolving its fabrication processes and developing new processes to produce smaller and smaller geometries of the semiconductor devices being manufactured, because smaller devices typically generate less heat and operate at higher speeds than larger devices. Currently, a single integrated circuit chip may contain over one billion patterns. Consequently, semiconductor fabrication processes are extremely complex, and hundreds of processing steps may be involved. The occurrence of a mistake or small error at any of the process steps or tool specifications may cause lower yield in the final semiconductor product, where yield may be defined as the number of functional devices produced by the process as compared to the theoretical number of devices that could be produced assuming no bad devices.

Improving yield is a critical problem in the semiconductor manufacturing industry and has a direct economic impact on it. In particular, a higher yield translates into more devices that may be sold by the manufacturer, and, hence, greater profits.

Typically, semiconductor manufacturers collect data about various semiconductor fabrication process parameters and analyze the data and, based on data analysis, adjust process steps or tool specifications in an attempt to improve the yield of the process. Today, the explosive growth of database technology has facilitated the yield analyses that each manufacturer performs. In particular, the database technology has far outpaced the yield management analysis capability when using conventional statistical techniques to interpret and relate yield to major yield factors. This has created a need for a new generation of tools and techniques for automated and intelligent database analysis for semiconductor yield management.

Many conventional yield management systems have a number of limitations and disadvantages which make them undesirable to the semiconductor manufacturing industry. For example, conventional systems may require some manual processing which slows the analysis and makes the system susceptible to human error. In addition, these conventional systems may not handle both continuous (e.g., temperature) and categorical (e.g., Lot 1, Lot 2, etc.) yield management variables. Some conventional systems cannot handle missing data elements and do not permit rapid searching through hundreds of yield parameters to identify key yield factors. Some conventional systems output data that is difficult to understand or interpret even by knowledgeable semiconductor yield management personnel. In addition, conventional systems typically process each yield parameter separately, which is time consuming and cumbersome and cannot identify more than one parameter at a time.

U.S. Pat. No. 6,470,229 B1 assigned to the same assignee as the present application discloses a yield management system and technique for processing a yield data set containing one or more prediction variable values and one or more response variable values to remove prediction variables with missing values and data sets with missing values. The processed data can then be used to generate a yield model preferably in the form of a decision tree. The system can also accept user input to modify the generated model.

While the yield management system and technique disclosed in aforementioned U.S. Pat. No. 6,470,229 B1 provide a powerful yield management tool, one limitation is that the criteria employed for processing data sets may remove data sets with missing values, even though the data sets may contain usable data respecting a significant prediction variable that may be useful in generating the model. Also, while the disclosed system and technique provide fundamental splitting rules for generating a decision-tree based model, there are instances in which the system is limited in the variety of splitting rules and also limited in accommodating modification of the model based on the knowledge of the user.

Thus, it would be desirable to provide a yield management system and method which overcome the above limitations and disadvantages of conventional systems and facilitate building a more accurate model. It is to this end that the present invention is directed. The various embodiments of the present invention provide many advantages over conventional methods and yield management systems.

SUMMARY OF THE INVENTION

One embodiment of the yield management system and method in accordance with the present invention provides many advantages over conventional yield management systems and techniques, which make the yield management system and method in accordance with the present invention more useful to semiconductor manufacturers. The system may be fully automated and is easy to use, so that no extra training is necessary to make use of the yield management system. In addition, the yield management system handles both continuous and categorical variables. The system also automatically handles missing data during a processing step that is optimized to consider data for all significant yield parameters. The system can rapidly search through hundreds of yield parameters and generate an output indicating the one or more key yield factors/parameters. The system generates an output preferably in the form of a decision tree that is easy to interpret and understand. The system may employ advanced splitting rules to parse the data and is also very flexible in that it permits prior yield parameter knowledge from one or more users to be easily incorporated into the building of the model. Unlike conventional yield management systems, if there is more than one yield factor/parameter affecting the yield of the process, the system can identify all of the parameters/factors simultaneously, so that the multiple factors/parameters are identified during a single pass through the yield data.

In accordance with various embodiments of the present invention, the yield management system and method may receive a yield data set. When an input data set is received, one embodiment of the yield management system and method in accordance with the present invention first performs a data processing step in which the validity of the data in the data set is checked, and cases or parameters with missing data are identified. One embodiment of the semiconductor yield management system and method in accordance with the present invention provides a tiered splitting method to maximize usage of all valid data points. Another embodiment of the yield management system and method in accordance with the present invention provides an outlier filtering method. Also, in accordance with various other embodiments of the yield management system and method of the present invention, a user can select from among 1) add tool usage parameters, 2) treat an integer as categorical, and 3) auto-categorize methods for better data manipulation capability and flexibility.

The semiconductor yield management system and method in accordance with one embodiment of the present invention also preferably provide a linear type split and a range type split for use in constructing the model when the response variable and the prediction variable have a linear relationship, in order to overcome the shortcoming of a binary decision tree that has to split on the prediction variable several times on different levels and does not necessarily show that the relationship is linear. The semiconductor yield management system and method in accordance with various embodiments of the present invention also provide user control in formulating the rules for splitting nodes, so that the user may assure that more appropriate and accurate models are generated. Preferably, the user selectable split methods include: 1) consider tool and date parameters jointly; 2) consider tool and event parameters jointly; 3) maximize class distinction; 4) prefer simple splits; 5) minimum purity; 6) parameter weighting; 7) minimum group size; 8) maximum number of descendants; and 9) raw data mapping.

Additionally, if the prediction variable is categorical, one embodiment of the yield management system and method in accordance with the present invention enables the user to select any combination of classes of the variable and include them in one sub-node of the decision tree. The remainder of the data is included in the other sub-node. On the other hand, if the prediction variable is continuous, there are preferably three types of split formats from which the user may select. The available split formats are 1) a default type ($a \leq X$), 2) a range type ($a1 \leq x < a2$), and 3) a linear type ($X < a1$, X in [a1, a2], X in [a2, a3], X>a3). These different split formats facilitate the user being able to produce an accurate model.

Using the cleaned-up data set, a yield mine model is built during a model building step. Once the model is generated automatically by the yield management system and method in accordance with the present invention, the model may be further modified by one or more users based on their experience or prior knowledge of the data set.

The yield management system and method in accordance with one embodiment of the present invention also preferably enable the user to select a method to generate multiple models simultaneously, so that the user may choose a group of parameters for the model building. The yield management system and method in accordance with the present invention then generate a model for each of the parameters selected by the user.

Another embodiment of the yield management system and method in accordance with the present invention additionally enables the user to invoke a method to redisplay the setup window and quickly modify his or her previous selections, so that the model may be adjusted. Finally, the yield management system and method in accordance with another embodiment of the present invention enable the user to invoke methods to collapse/expand a node to collapse the node when the user decides that the split of the node is unnecessary or, alternatively, to expand the node when the user wants to examine the aggregate statistics of the entire subset. The method to expand a node may also be invoked by the user to expand a previously collapsed node, so that the node returns to its original length.

After the model has been modified, the data set may be processed using various statistical analysis tools to help the user better understand the relationship between the prediction and response variables. The yield management system and method in accordance with the present invention provide a yield management tool that is much more powerful and flexible than conventional tools.

The foregoing and other objects, features, and advantages of the present invention will become more readily apparent from the following detailed description of various embodiments, which proceeds with reference to the accompanying drawing.

BRIEF DESCRIPTION OF THE DRAWING

The various embodiments of the present invention will be described in conjunction with the accompanying figures of the drawing to facilitate an understanding of the present invention. In the figures, like reference numerals refer to like elements. In the drawing:

FIG. 3 is a flowchart illustrating an example of a yield management method in accordance with one embodiment of the present invention;

FIG. 4 is a diagram illustrating a known data processing procedure;

FIG. 10 is a diagram illustrating a data processing procedure to add tool usage parameters in accordance with one embodiment of the method of the present invention;

DETAILED DESCRIPTION OF THE PREFERRED EMBODIMENTS

The present invention is particularly applicable to a computer-implemented software-based yield management system, and it is in this context that the various embodiments of the present invention will be described. It will be appreciated, however, that the yield management system and method in accordance with the present invention have greater utility, since they may be implemented in hardware or may incorporate other modules or functionality not described herein.

Figure 1:
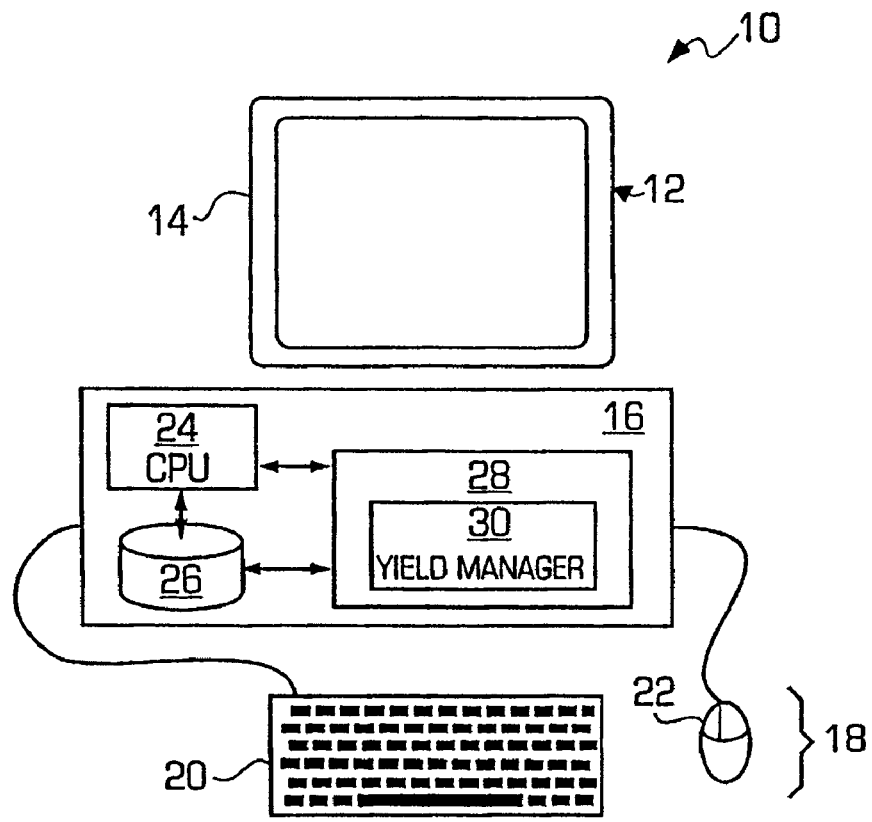
FIG. 1 is a block diagram illustrating an example of a yield management system in accordance with one embodiment of the present invention implemented on a personal computer.

FIG. 1 is a block diagram illustrating an example of a yield management system 10 in accordance with one embodiment of the present invention implemented on a personal computer 12. In particular, the personal computer 12 may include a display unit 14, which may be a cathode ray tube (CRT), a liquid crystal display, or the like; a processing unit 16; and one or more input/output devices 18 that permit a user to interact with the software application being executed by the personal computer. In the illustrated example, the input/output devices 18 may include a keyboard 20 and a mouse 22, but may also include other peripheral devices, such as printers, scanners, and the like. The processing unit 16 may further include a central processing unit (CPU) 24, a persistent storage device 26, such as a hard disk, a tape drive, an optical disk system, a removable disk system, or the like, and a memory 28. The CPU 24 may control the persistent storage device 26 and memory 28. Typically, a software application may be permanently stored in the persistent storage device 26 and then may be loaded into the memory 28 when the software application is to be executed by the CPU 24. In the example shown, the memory 28 may contain a yield manager 30. The yield manager 30 may be implemented as one or more software applications that are executed by the CPU 24.

In accordance with the present invention, the yield management system 10 may also be implemented using hardware and may be implemented on different types of computer systems, such as client/server systems, Web servers, mainframe computers, workstations, and the like. Now, more details of an exemplary implementation of the yield management system 10 in software will be described.

Figure 2:
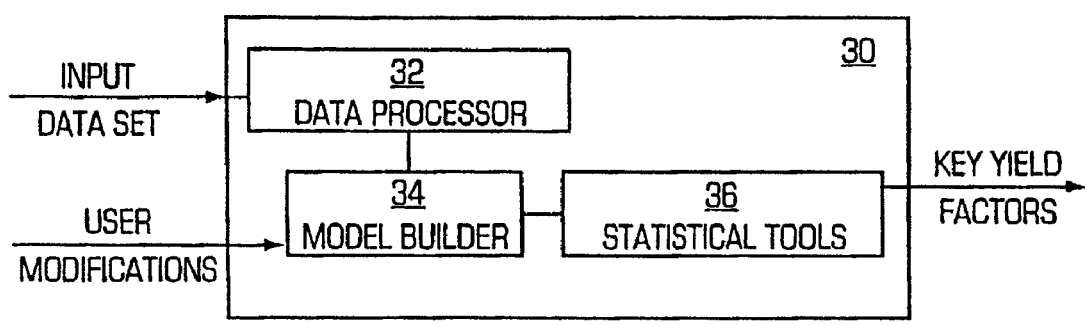
FIG. 2 is a block diagram illustrating more details of the yield management system in accordance with the embodiment of the present invention shown in FIG. 1.

FIG. 2 is block diagram illustrating more details of the yield manager 30 in accordance with one embodiment of the present invention. In particular, the yield manager 30 may receive a data set containing various types of semiconductor process data, including continuous/numerical data, such as temperature or pressure, and categorical data, such as the lot number of the particular semiconductor device or integrated circuit. The yield manager 30 may process the data set, generate a model, apply one or more statistical tools to the model and data set, and generate an output that may indicate, for example, the key factors/parameters that affected the yield of the devices that generated the current data set.

Considered in more detail, as shown in FIG. 2, the data set may be input to a data processor 32 that may optimize and validate the data and remove incomplete data records. The output from the data processor 32 may be fed into a model builder 34, so that a model of the data set may be automatically generated by the yield manager 30. Once the model builder 34 has generated a model, the user may preferably enter model modifications into the model builder to modify the model based on, for example, past experience with the particular data set. Once any user modifications have been incorporated into the model, a final model is output and is preferably made available to a statistical tool library 36. The library 36 may contain one or more different statistical tools that may be used to analyze the final model. The output of the yield manager 30 may be, for example, a listing of one or more factors/parameters that contributed to the yield of the devices that generated the data set being analyzed. As described above, the yield manager 30 is able to simultaneously identify multiple yield factors. Now, a yield management method in accordance with one embodiment of the present invention will be described.

By way of background, data preparation is always an important aspect of any yield management system. Sometimes, 90% of the time is spent on cleaning up and making the data suitable for analysis.

Data collected from semiconductor metrology tools often contain missing data and outliers, which cause problems for analysis. In order to deal with these problems, once the user obtains data from the metrology tool, a preferred embodiment of the semiconductor yield management system and method in accordance with the present invention may maximize the usage of all valid data points for key yield factors/parameters. The preferred embodiment also preferably provides a range of methods for filtering out outliers. These methods will now be described in detail.

FIG. 3 is a flowchart illustrating an example of a yield management method 40 in accordance one embodiment of the present invention. The method may include receiving an input data set, as indicated by a step 41 shown in FIG. 3, and processing the input data set, as indicated by a step 42 shown in FIG. 3, to clean up the data set (e.g., optimize data usage and validate the data and remove data records containing missing, erroneous, insignificant, or invalid data elements).

As indicated by a step 44 shown in FIG. 3, the cleaned-up data set may be used to build one or more models; and the user may enter model modifications, as indicated by a step 46 shown in FIG. 3. Once the model is complete, it may be analyzed, as indicated by a step 48 shown in FIG. 3, using a variety of different statistical tools to generate yield management information, such as key yield factors. Each of the above steps will now be described in more detail to provide a better understanding of the method in accordance with the various embodiments of the present invention. In particular, the data processing step 42 in accordance with the method of the present invention will now be described.

The data processing step 42 shown in FIG. 3 helps to clean up the incoming data set so that the later analysis may be more fruitful. The yield management system 10 shown in FIG. 1 can handle data sets with complicated data structures. A yield data set typically has hundreds of different variables. These variables may include both a response variable, Y, and prediction variables, $X_1, X_2, \ldots, X_m$, that may be of a numerical type or a categorical type. On the one hand, a variable is a numerical type variable if its values are real numbers, such as different temperatures at different times during the semiconductor fabrication process. On the other hand, a variable is a categorical type variable if its values are of a set of finite elements not necessarily having any natural ordering. For example, a categorical variable may take values in a set of {MachineA, MachineB, or MachineC} or values of (Lot1, Lot2, or Lot3).

It is common for a yield data set to have missing values. U.S. Pat. No. 6,470,229 B1 discloses a data processing step that preferably removes the cases or variables having missing values. In particular, the processing may initially remove all prediction variables that are "bad". By "bad", it is understood that either a variable has too much missing data, $\geq MS$, or, for a categorical variable, if the variable has too many distinct classes, $\geq DC$. Aforementioned U.S. Pat. No. 6,470,229 B1 discloses that both MS and DC may be user-defined thresholds, so that the user may set these values and control the processing of the data set. For example, the default values may be MS=0.05×N, DC=32, where N is the total number of cases in the data set.

U.S. Pat. No. 6,470,229 B1 discloses that once the "bad" prediction variables are removed, then, for the remaining data set, data processing may remove all cases with missing data. If one imagines that the original data set is a matrix with each column representing a single variable, then data processing first removes all "bad" columns (variables) and then removes "bad" rows (missing data) in the remaining data set with the "good" columns.

FIG. 4 is a diagram illustrating an example of the data processing technique disclosed in U.S. Pat. No. 6,470,229 B1. In particular, for this example, the MS variable is set to 2. FIG. 4 shows an original data set 50, a data set 52 once "bad" columns have been removed, and a data set 54 once "bad" rows have been removed. As shown, the original data set 50 may include three prediction variables (PRED1, PRED2, and PRED3) and a numerical response variable (RESPONSE) in which three values for PRED3 are unknown and one value for PRED2 is unknown. Since the MS value is set to 2 in this example, any prediction variable that has more than two unknown values is removed. Thus, as shown in the processed data set 52, the column containing the PRED3 variable is removed from the data set. Since the PRED2 variable has only one missing value, it is not removed from the data set in this step. Next, any "bad" rows of data are removed from the data set. In the example shown in FIG. 4, the row with a PRED1 value of 0.5 is removed, because the row contains an unknown value for variable PRED2. Thus, once the processing has been completed, the data set 54 contains no missing values.

In practice, however, data sets for semiconductor fabrication processes employed in the semiconductor manufacturing industry typically contain missing data. It is extremely inefficient if all the cases with missing data are discarded. For example, assume a data set with 500 parameters and 1.0% of the data points are missing. This is not uncommon in the semiconductor industry. If the 1.0% missing data are randomly distributed, the probability of obtaining a complete observation without a single missing measurement is about 0.65%. This means more than 99% of the cases contain missing measurements.

To solve this problem, the yield management system and method in accordance with a preferred embodiment of the present invention provide a tiered splitting method. The tiered splitting method takes advantage of the fact that a split rule of a decision tree typically only involves a few parameters (most likely just one parameter) at a time. The tiered splitting method in accordance with a preferred embodiment of the present invention operates as follows.

In accordance with the tiered splitting method of the present invention, at the top node, for each parameter combination $(P_1, P_2, \ldots, P_m)$ that is a candidate set for a split rule, only cases in this particular set having missing values for a selected parameter are removed by a first processing step. Typically, $m \leq 2$; therefore, most cases are preserved after the top node split. The same tiered splitting method may also be used in subsequent splits.

Figures 5, 5A:
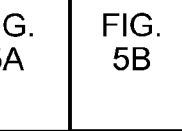
FIG. 5 is a diagram illustrating a tiered splitting data processing procedure in accordance with one embodiment of the method of the present invention.
Figure 5B:
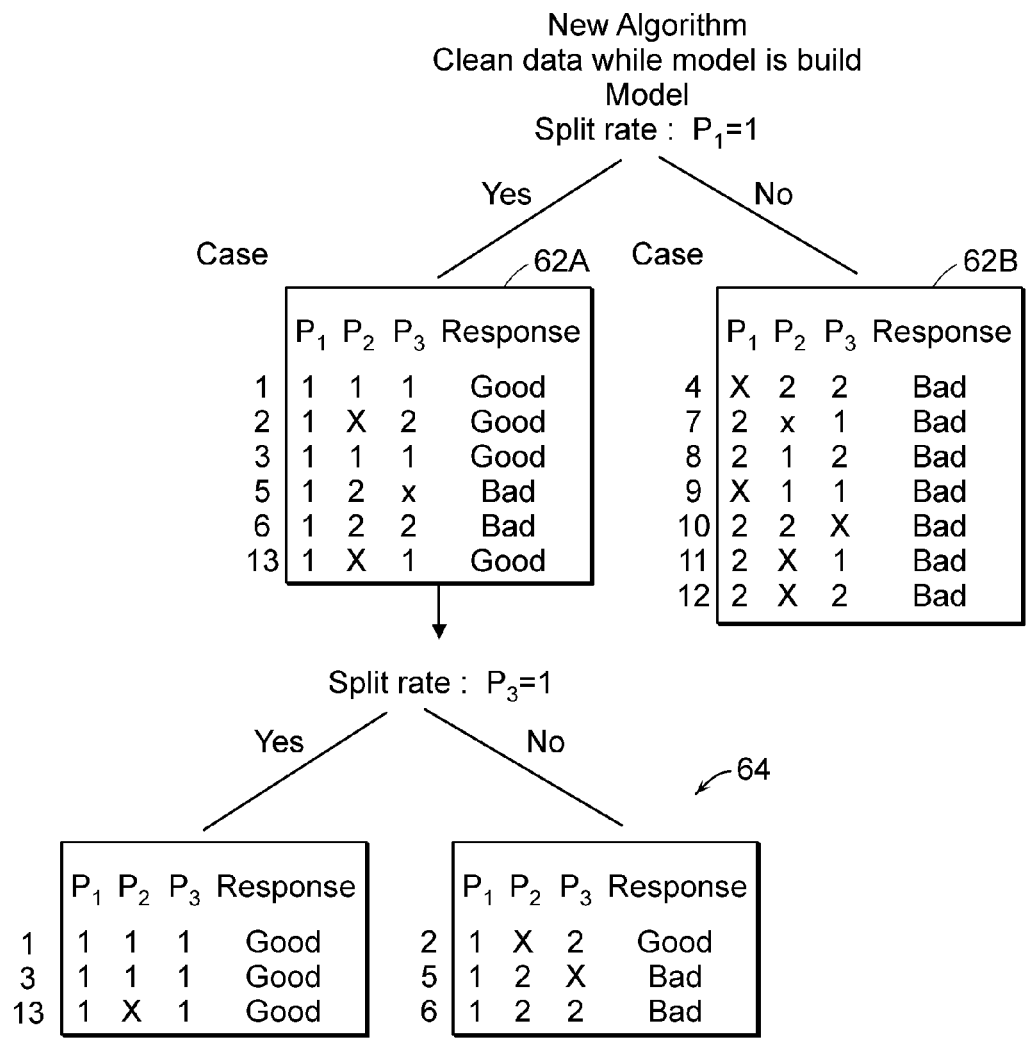

FIG. 5 shows an example of how missing data are preferably treated using data processing disclosed in U.S. Pat. No. 6,470,229 B1 with the MS value set to 6 and in accordance with data processing employing tiered splitting in accordance with the method of the present invention. As shown in FIG. 5, the original data set 56 contains three prediction variables ($P_1$, $P_2$, and $P_3$) and one response variable (Response) and 13 cases.

With the MS value set to 6, no "bad" columns appear in FIG. 5, because the parameter having the most missing values is $P_2$, which has only 5 missing values. However, cases 2, 4, 5, 7, 9, 10, 11, 12, and 13 are "bad" rows because they have unknown values and are consequently removed during processing by the technique disclosed in U.S. Pat. No. 6,470,229 B1. Hence, cleaned-up data 58 using processing in accordance with U.S. Pat. No. 6,470,229 B1 preferably contains no unknown values.

The tiered splitting method in accordance with the present invention is based on designating a candidate parameter for a split rule at the time of processing and a value for that parameter during processing. For example, as shown in FIG. 5, the candidate parameter is $P_1$, and the value for $P_1$ used during processing is "1". The cleaned-up data 62A contains all cases having a value of "1" for $P_1$. In contrast, cases missing a value for $P_1$ are removed, and all cases having a value for $P_1$ other than "1" are also removed. The removed data 62B are also shown in FIG. 5.

The advantage of tiered splitting can be shown by then applying a split rule $P_3=1$ to the cleaned-up data. On the one hand, applying this split rule ($P_3=1$) to the data set produced by the processing technique disclosed in U.S. Pat. No. 6,470,229 B1 results in a model 60 shown in FIG. 5. On the other hand, applying the split rule ($P_3=1$) to the cleaned-up data produced by the tiered splitting method in accordance with the present invention results in a model 64 and contains an additional set of data. Thus, in comparison, the technique disclosed in U.S. Pat. No. 6,470,229 B1 losses more information in building the model and may be less accurate.

Additionally, outliers are common in semiconductor fabrication process data sets. Outliers are data that do not lie within a normal statistical distribution. They are caused by a variety of factors as simple as mistypes. Because of the extreme values of outliers, a model generated from the data set may be distorted and misleading. In many cases, the user is aware of the existence of outliers and would like to remove them from consideration. The preferred embodiment of the semiconductor yield management system and method in accordance with the present invention provides an easy to use method, preferably available as an option for selection by a user, to filter out the outliers automatically.

Figure 6:
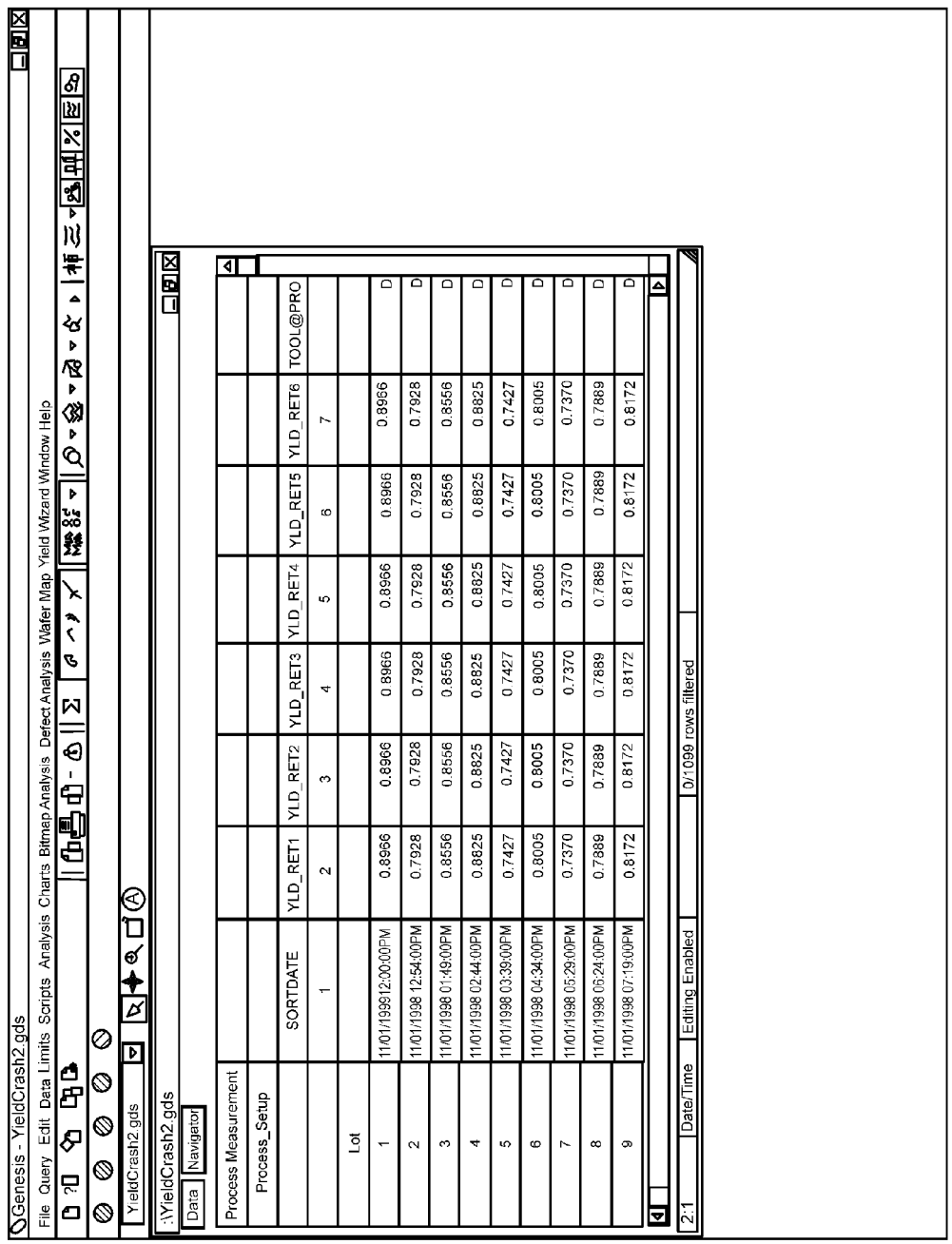
FIG. 6 illustrates an initial display screen displayed by the yield management system shown in FIG. 1.
Figure 7:
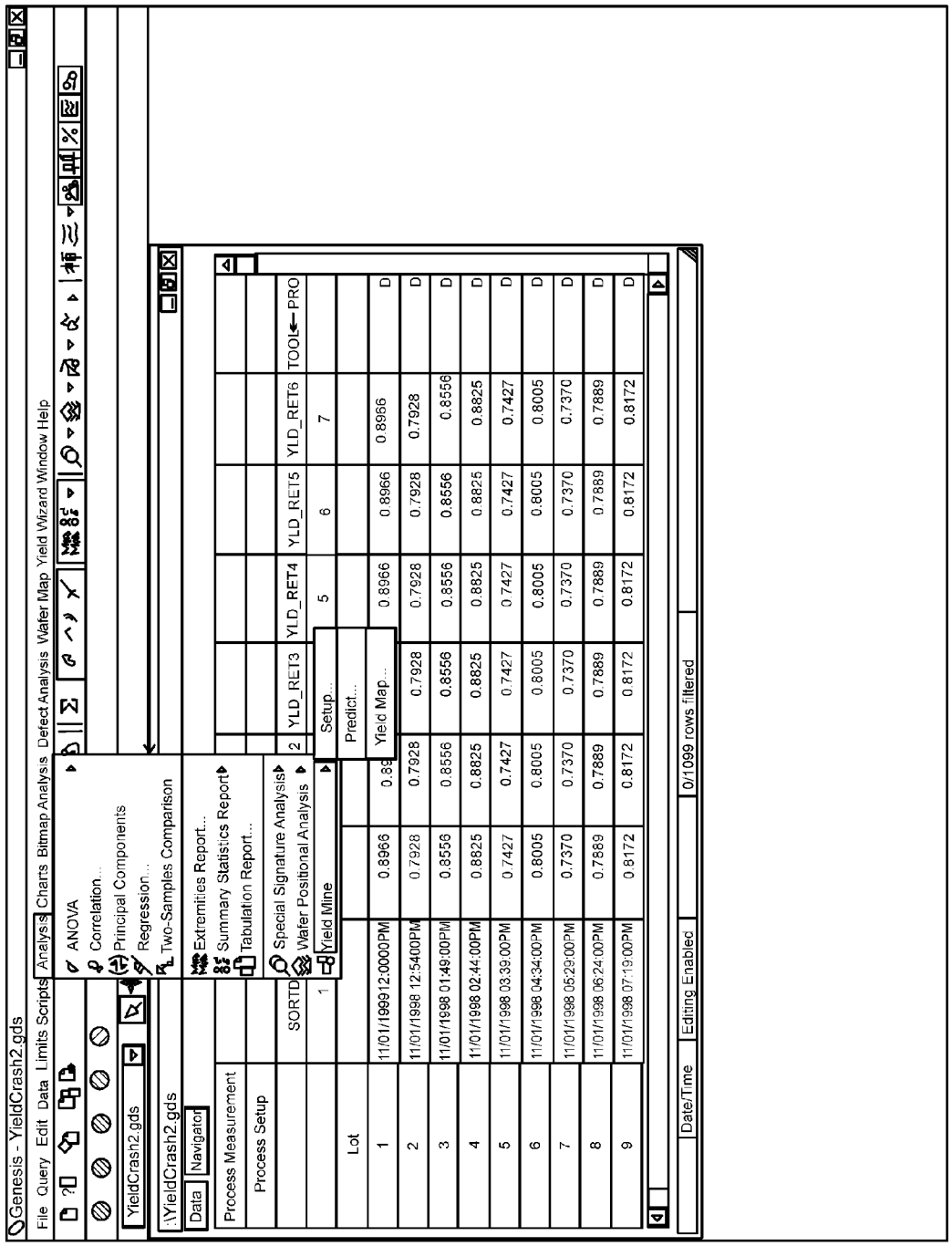
FIG. 7 illustrates a drop-down menu that appears when a user positions a mouse pointer on "Analysis" which appears in the menu bar of the display screen shown in FIG. 6 and clicks the left mouse button and then positions the mouse pointer on "Yield Mine" in the drop-down menu.
Figure 8:
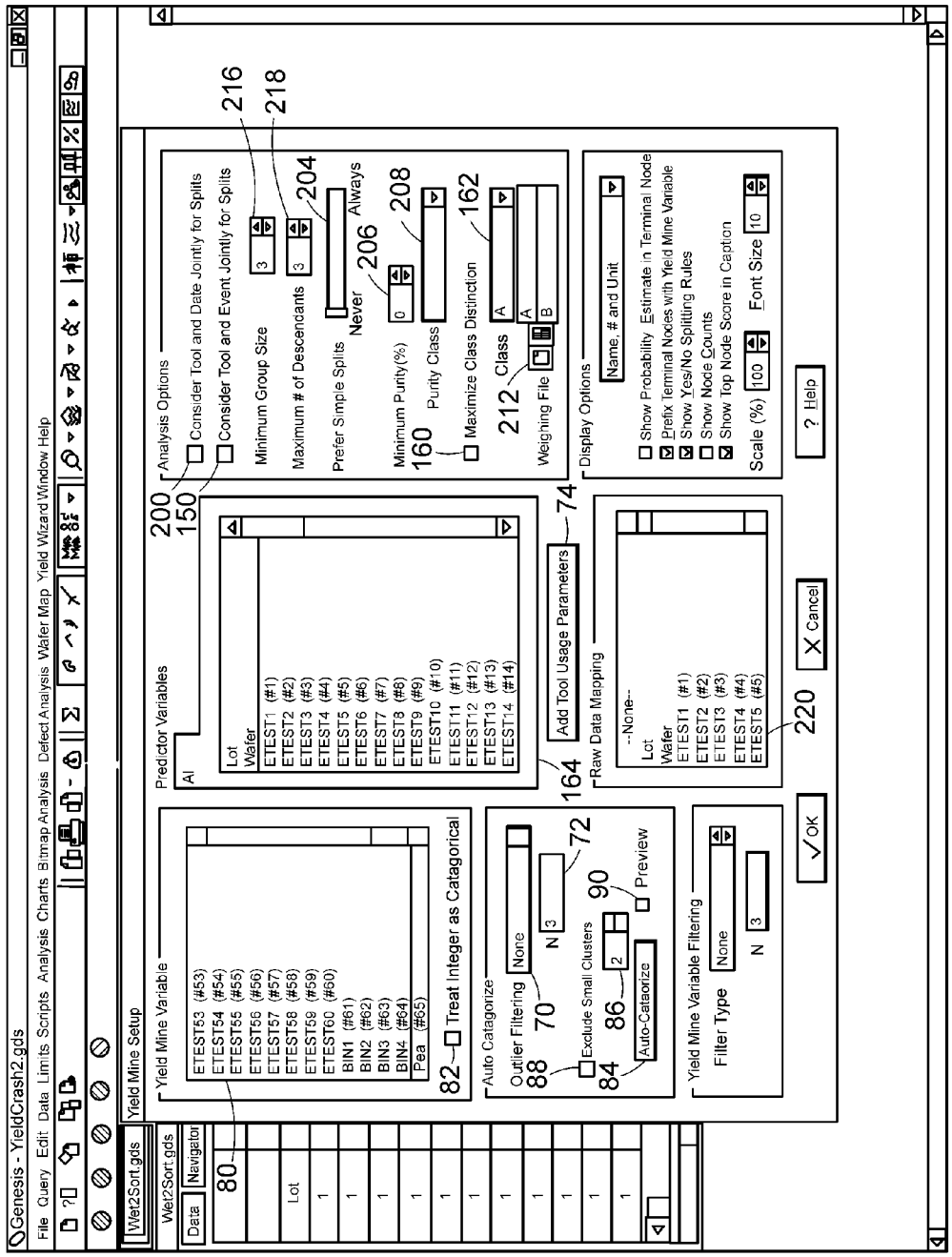
FIG. 8 illustrates a setup display screen which appears when the user positions the mouse pointer on "Setup" in the drop-down menu illustrated in FIG. 7 and clicks the left mouse button.

FIG. 6 illustrates an initial display screen displayed by the yield management system 10 shown in FIG. 1. FIG. 7 illustrates a drop-down menu that appears when a user positions the mouse pointer on "Analysis" in the menu bar that appears on the display screen shown in FIG. 6 and clicks the left mouse button. FIG. 8 illustrates a setup display screen which appears when the user positions the mouse pointer on "Setup" in the drop-down menu illustrated in FIG. 7 and clicks the left mouse button.

Figure 9:
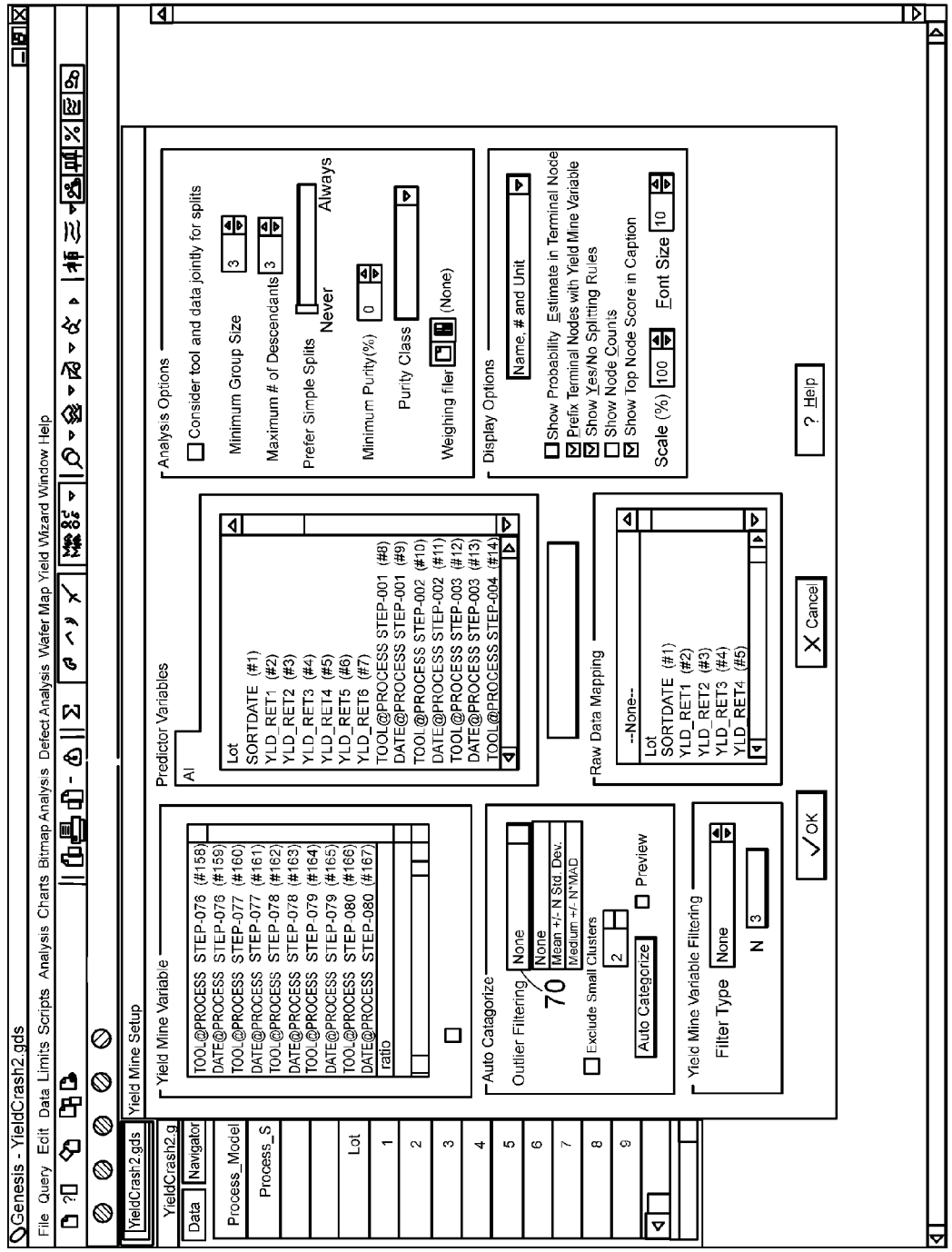
FIG. 9 illustrates a scroll-down list that enables a user to select a method to have the yield management system of the present invention filter outliers.

As shown in FIG. 8, in the setup screen for the yield management system 10 (FIG. 1), the user may invoke the outlier filtering method in accordance with the present invention by positioning the mouse pointer on an "Outlier Filtering" box 70 and clicking the left mouse button. Preferably, the following three outlier filtering options are available to the user and appear in a drop-down list, as shown in FIG. 9:

1) None—No outlier filtering is performed. This is preferably the default and is the option initially displayed by the setup screen shown in FIG. 8.
2) Mean ±N*std—In this case, the user also has the option to select a threshold value N, which the user enters in a data entry box 72 shown in FIG. 8 by positioning the mouse pointer on the up/down arrows and clicking the left mouse button, or by entering a value in the box using the numerical keys on the keyboard 20. The variable mean and standard deviation are preferably calculated according to the following formulae:

$$\text{Mean} = \sum_{i=1}^{n} x_i / n \quad \text{(Equation 1)}$$

$$std = \sqrt{\sum_{i=1}^{n} (x_i - \text{Mean})^2 / (n-1)} \quad \text{(Equation 2)}$$

The yield management system 10 removes cases outside the range of Mean ±N*std.
3) Median ±N*MAD—This is similar to the previous option, except the standard deviation is replaced by MAD, which is preferably calculated according to the following formula:

$$MAD = \sum_{i=1}^{n} |x_i - \text{Mean}| / n \quad \text{(Equation 3)}$$

Also, in accordance with a preferred embodiment of the yield management method of the present invention, the user may select from among methods to add tool usage parameters, treat an integer as a categorical variable, and auto-categorization of data for better data manipulation capability and flexibility in connection with processing data sets at step 42 shown in FIG. 3. These methods will now be described in detail.

A first method, preferably available as an option for selection by the user, is to add tool usage parameters. The semiconductor device or integrated circuit manufacturing process may be extremely complex. It is quite common that a wafer has to pass more than 100 process steps. Among these steps, the same tool, for example, an etcher, may be used multiple times at different process steps for the same lot. This multiple usage magnifies the impact of the tool on the final yield. Based on this consideration, it may be desirable to construct parameters based on the number of times that a tool is used.

As shown in FIG. 8, one embodiment of the semiconductor yield management system and method in accordance with the present invention may enable the user to select construction of tool usage parameters in its setup. In particular, when the user places the mouse pointer on an "Add Tool Usage Parameters" button 74 shown in FIG. 8 and clicks the left mouse button, the yield management system 10 automatically processes the data set to identify the number of times that each tool is used during the semiconductor fabrication process. The tool usage parameter is a number that equals the number of times that a particular tool is used in each case contained in the data set for the semiconductor fabrication process under analysis. For example, a data set 76 shown in FIG. 10 contains three parameters $P_1$, $P_2$, and $P_3$, one response variable (Response), and four cases. The values for the prediction variables are either "Etch1" or "Etch2" relating to the use of two etchers. When the user clicks on the "Add Tool Usage Parameters" button 74 shown in FIG. 8, the yield management system 10 determines the number of times each tool ("Etch1" and/or "Etch2") were used for each case, and tabulates the tool usage data during processing to produce a new data set 78 shown in FIG. 10. As shown, the data set 78 contains two new columns that specify the number of times each of the tools "Etch1" and "Etch2" were used in connection with each case. In particular, for the first case, tool "Etch1" generated the values of all three parameters $P_1$, $P_2$, and $P_3$ (i.e., the new "Etch1" parameter in the data set 78 is "3"), and tool "Etch2" was not used (i.e., the new "Etch2" parameter in the data set 78 is "0"). The newly constructed parameters may aid in identifying tool problems.

As shown in FIG. 8, a second method, preferably available as an option for selection by the user, is to treat an integer as a categorical variable. Parameters with integer values are quite common in a semiconductor fabrication process data set. Occasionally, an integer is simply a class name and does not imply a relative scale between its value and other integer values. In this case, the variable may be appropriately treated as a categorical variable, instead of a continuous variable.

One embodiment of the semiconductor yield management system and method in accordance with the present invention provides an option in its setup selectable by the user to treat an integer as a categorical variable. In particular, as shown in FIG. 8, the user first highlights the selected variable in a scroll-down list 80 by positioning the mouse pointer on the listed variable and clicking the left mouse button. The user then positions the mouse pointer on a "Treat Integer as Categorical" check box 82 and clicks the left mouse button to designate the highlighted variable as a categorical variable. When the treat integer as categorical method is invoked by the user, the semiconductor yield management system and method in accordance with the present invention handle the variable as a categorical variable, rather than a continuous variable.

A third method, preferably available as an option for selection by the user, is auto-categorization. The distribution of a variable in a semiconductor fabrication process data set is typically not uniform or Gaussian. Occasionally, the distribution exhibits multiple local maxima. In this case, the user may want to bin the data into classes. This type of data manipulation is preferably made automatic in the semiconductor yield management system and method in accordance with the present invention.

In accordance with the semiconductor yield management system and method of the present invention, the user positions the mouse pointer on an "Auto-Categorize" button 84 shown in FIG. 8 and clicks the left mouse button to invoke the auto-categorization method. Within this option, the user may decide the number of categories in a data entry box 86 by positioning the mouse pointer on the up/down arrows and clicking the left mouse button, or by entering a value in the box using the numerical keys on the keyboard 20. The user also chooses if small clusters are to be excluded by positioning the mouse pointer on a check box 88 and clicking the left mouse button. The user may also select appropriate treatment for outliers using the outlier filtering method described earlier. A preview check box 90, which the user may select by positioning the mouse pointer on the box and clicking the left mouse button, is preferably provided to enable the user to view the results and make appropriate adjustments. Data clustering is preferably performed using the nearest neighbor method well-known to persons skilled in the art. In one implementation, the user can select up to 12 bins. The result of auto-categorization is the creation of a new categorical variable. This variable serves as the new response variable for the yield management system and method in accordance with the present invention.

Once processing of the input data set is complete, the yield management system and method in accordance with the present invention build the yield model. Now, the model building step 44 shown in FIG. 3 will be described in more detail.

The yield management system 10 in accordance with the various embodiments of the present invention preferably uses a decision-tree-based method to build a yield model. In particular, the method partitions a data set, D, into sub-regions. The decision tree structure may be a hierarchical way to describe a partition of D. It is constructed by successively splitting nodes (as described below), starting with the root node (D), until some stopping criteria are met and the node is declared a terminal node. For each terminal node, a value or a class is assigned to all the cases within the node. Now, the node splitting method in accordance with various embodiments of the present invention and examples of decision trees will be described in more detail.

Figure 11:
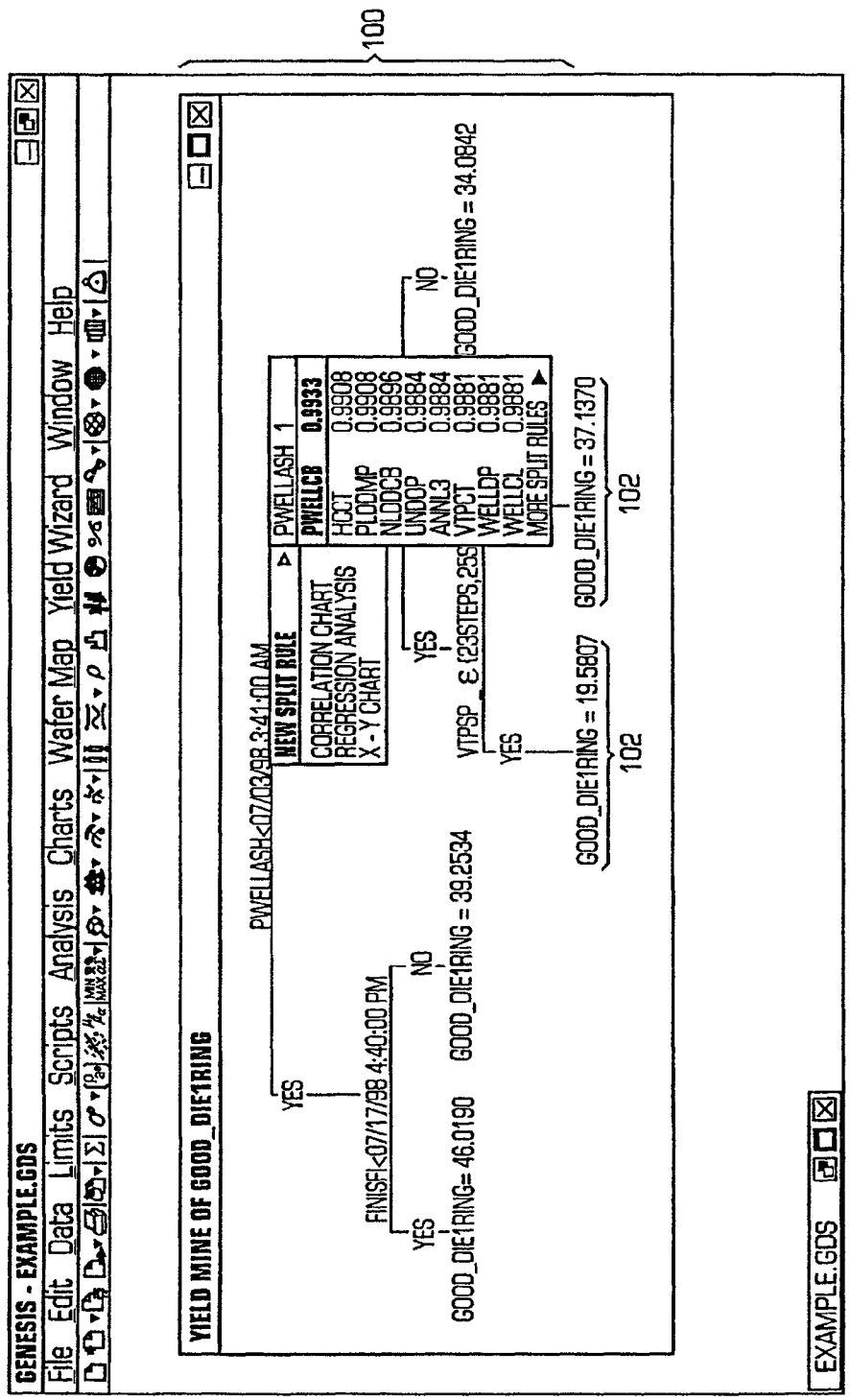
FIG. 11 illustrates an example of a yield parameter being selected by the user and a decision tree node being automatically split or manually split in accordance with one embodiment of the method of the present invention.

In general, FIG. 11 shows an example of a yield mine model decision tree 100 that may be generated by the yield management system 10 (FIG. 1). In this example, the data set contains 233 process step variables, 233 time variables corresponding to each process step, and 308 parametric test variables. However, only a portion of the variables is shown in FIG. 11 for clarity. All of these variables are used in the yield mine model building as prediction variables. The response variable in this example is named "GOOD_DIEIRING" and represents the number of good dies around the edge of a wafer produced during a particular semiconductor fabrication process run.

In this example, out of all 774 prediction variables, the yield mine model using decision tree prediction identifies one or more variables as key yield factors. In the example, the key yield factor variables are PWELLASH, FINISFI, TI_ TIN_RTP_ (hidden by the overlying window), and VTPSP_. In this example, PWELLASH and FINISFI are time variables associated with the process variables PWELLASH_and FINISFI_, and TI_TIN_RTP_and VTPSP_are process variables. Note that, for each terminal node 102 in the decision tree, the numerical value of the response variable at that terminal node is shown, so that the user can view the tree and easily determine which terminal node (and thus which prediction variables) result in the best value of the response variable.

In the decision tree structure model shown in FIG. 11, if a tree node is not terminal, it has a splitting criterion for the construction of its sub-nodes, as will be described in more detail below with reference to FIG. 12. For example, the root node is split into two sub-nodes depending on the criterion of whether PWELLASH is before or after 3:41:00 AM, Jul. 3, 1998. If PWELLASH is before 3:41:00 AM, Jul. 3, 1998, the case is put in the left sub-node. Otherwise, it is put in the right sub-node. The left sub-node is further split into its sub-nodes using the criterion FINISFI <Jul. 17, 1998 4:40:00 PM. The right sub-node is also further split into its sub-nodes using the criterion TI_TIN_RTP_=2RTP, where TI_TIN_RTP_is a process step parameter and 2RTP is one of its specifications if the variable is continuous. For a terminal node, the average value of all cases under the node is shown. In this example, it is relatively clear to the user that when PWELLASH <Jul. 3, 1998 3:41:00 AM, the yield is higher, especially when the criterion FINISFI <Jul. 17, 1998 4:40:00 PM is also satisfied. The worst case occurs when PWELLASH ≧Jul. 3, 1998 3:41:00 AM, TI_TIN_RTP_<2RTP, and VTPSP_∈ {23STEPS, 25STEPS, 26STEPS}.

To find the proper stopping criteria for decision tree construction is a difficult problem. In order to deal with the problem, one may first over-grow the tree and then apply cross-validation techniques to prune the tree, as described in aforementioned U.S. Pat. No. 6,470,229 B1, the disclosure of which is hereby incorporated herein in its entirety by this reference. To grow an oversized tree, the method may keep splitting nodes in the tree until all cases in the node have the same response value, or the number of cases in the node is less than a user defined threshold, no. The default is preferably $n_0 = \max\{5, \text{floor}(0.02 \times N)\}$, where N is the total number of cases in D, and the function floor(x) gives the biggest integer that is less than or equal to x. Now, the construction of the decision tree and the method for splitting tree nodes in accordance with various embodiments of the present invention will be described.

Figure 12:
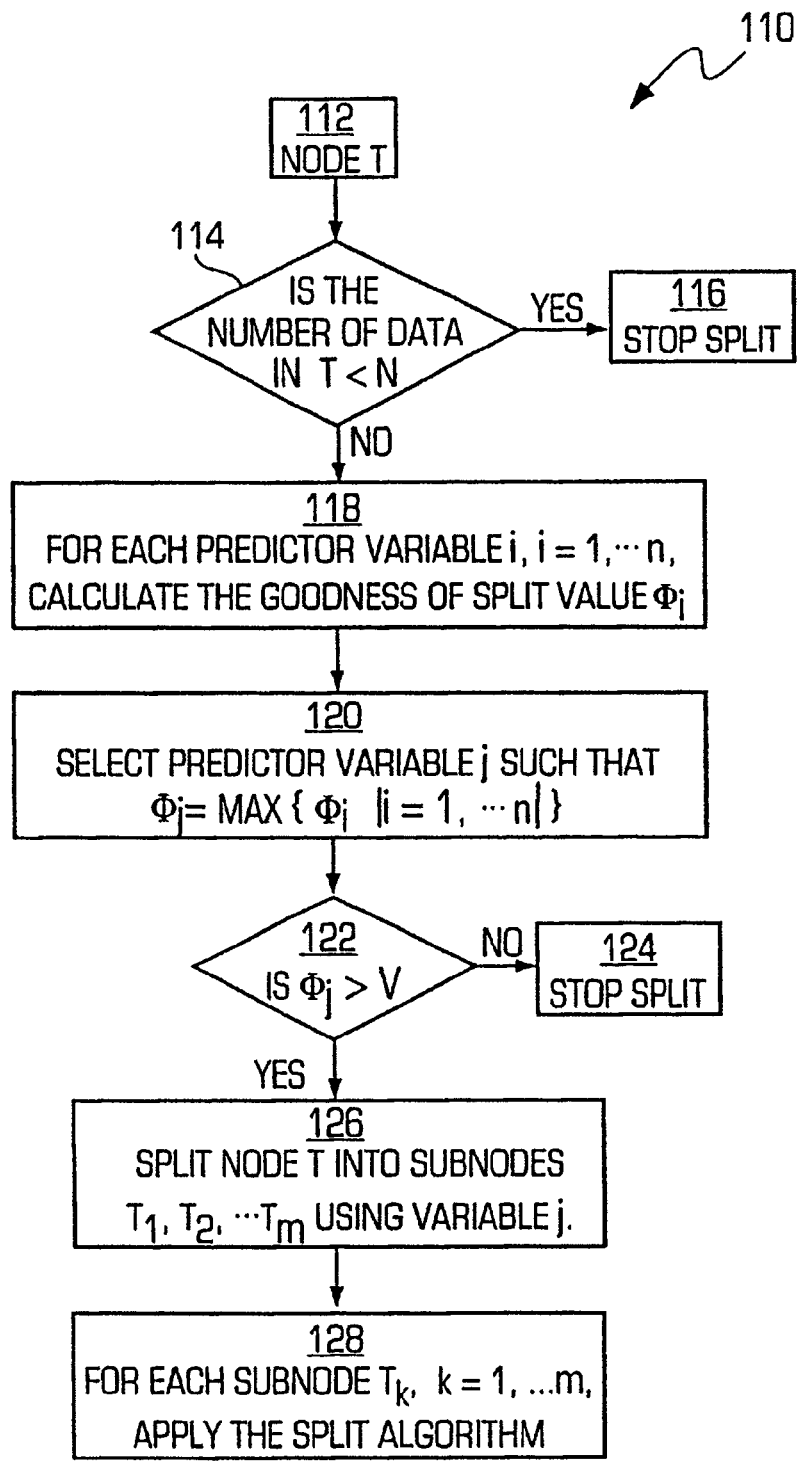
FIG. 12 is a flowchart illustrating a recursive node splitting method in accordance with one embodiment of the method of the present invention.

FIG. 12 is a flowchart illustrating a method 110 for splitting nodes of a decision tree. As indicated by a step 112 shown in FIG. 12, a particular node of a decision tree, T, is selected. The process is then repeated for each node of the tree.

As indicated by a step 114 shown in FIG. 12, the method may determine if the number of data values in node T is less than a predetermined threshold, N. If the number of data values is less than N, then the splitting for the particular node is stopped, as indicated by a step 116 shown in FIG. 12, and the next node may be processed.

If the number of data values for the node is not less than N, then, as indicated by a step 118 shown in FIG. 12, the processing of the particular node is continued. In particular, for each prediction variable, i, where i=1, ..., n, the "goodness" of the split value, $\Phi_i$, is calculated. Then, as indicated by a step 120 shown in FIG. 12, the prediction variables, j, are selected such that $\Phi_j = \text{MAX}\{\Phi_i | i=1, \ldots, n|\}$. As indicated by a step 122 shown in FIG. 12, the method may determine if $\Phi_j > V$, where V is a user-defined threshold value as described below. If $\Phi_j$ is not greater than the threshold value, then as indicated by a step 124 shown in FIG. 12, the splitting process for the particular node is stopped, and the processing continues with the next node.

If $\Phi_j > V$, then as indicated by a step 126 shown in FIG. 12, the node, T, is split into one or more sub-nodes, $T_1, T_2, \ldots, T_m$, based on the variable j. As indicated by a step 128 shown in FIG. 12, for each sub-node, $T_k$, where k=1, ..., m, the same node splitting technique is applied. In this manner, each node is processed to determine if splitting is appropriate, and then each sub-node created during a split is also checked for susceptibility to splitting, as well. Thus, the nodes of the decision tree are split. Now, more details of the decision tree construction and node splitting method will be described.

A decision tree is built to find relations between the response variable and the prediction variables. Each split, S, of a node, T, partitions the node into m sub-nodes $T_1$, $T_2, \ldots, T_m$, in hopes that the sub-nodes are less "noisy" than T, as defined below. To quantify this method, a real-value function that measures the noisiness of a node T, g(T), may be defined wherein $N^T$ denotes the number of cases in T, and $N^{Ti}$ denotes the number of cases in the ith sub-node $T_i$. The partition of T is exclusive; therefore, $$\sum_{i=1}^{m} N^{T_i} = N^T.$$

Next, one may define $\Phi(S)$ to be the goodness of split function for a split, S, wherein:

$$\Phi(S) = g(T) - \frac{1}{N^T} \sum_{i=1}^{m} N^{Ti} g(Ti) \quad \text{(Equation 4)}$$

We say that the sub-nodes are less noisy than their ancestor if $\Phi(S) > 0$. A node split may depend only on one prediction variable. The method may search through all prediction variables, $X_1, X_2, \ldots, X_n$, one by one to find the best split based on each prediction variable. Then, the best split is the one that minimizes $\Phi(S)$ and is preferably used to split the node. Generally, it is sufficient to explain the method by describing how to find the best split for a single prediction variable. Depending on the types of the response variable, Y, and the prediction variable, X, as being either categorical or numerical, there are four possible scenarios, as described in U.S. Pat. No. 6,470,229 B1. That patent describes in detail for each scenario how the split is constructed and how to assign a proper value or a class to a terminal node.

As described above, the most common form of split in the decision tree is a binary split. The binary split partitions the data into two subsets. This type of split is easy to understand and can be easily illustrated in a decision tree diagram, as described earlier. The drawback is that a binary split may be too restrictive and may not be able to show certain common types of relationship between the response variable and the prediction variable.

For example, when the response variable and the prediction variable have a linear relationship, a binary decision tree will have to split on the prediction variable several times on different levels. Unfortunately, the binary split does not necessarily show that the relationship is linear. In order to deal with this type of problem, various embodiments of the semiconductor yield management system and method in accordance with the present invention provide a linear type split method and a range type split method for use in constructing the model. These types of splits will now be described in detail.

The linear split method in accordance with one embodiment of the present invention operates as follows. When both the response variable, Y, and the prediction variable, X, are continuous, a linear relationship between Y and X is common. A typical binary split, of the type X>a, simply divides the prediction variable into two subsets and only indicates that the two subsets {X>a} and {X≦a} are different. Such a binary split does not necessarily mean that the relationship is linear. To explicitly show a continuous linear relationship, one embodiment of the semiconductor yield management system and method in accordance with the present invention employs a linear split rule.

Figure 13:
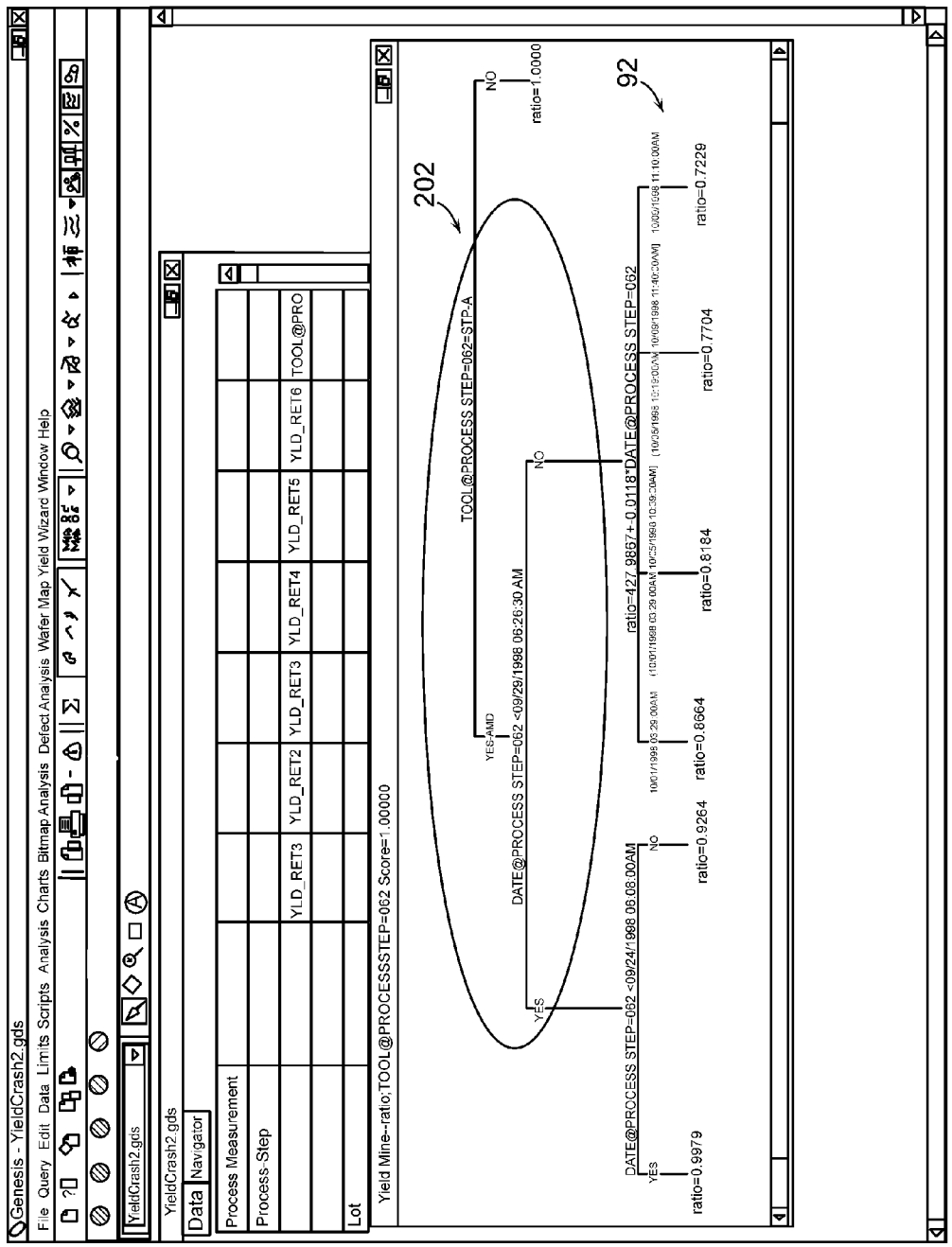
FIG. 13 illustrates an example of a yield parameter being selected by the user and a decision tree node being built based on a joint type split at a top level and based on a linear type split at a bottom level in accordance with various embodiments of the method of the present invention.

When the yield management system 10 shown in FIG. 1 identifies the relationship between X and Y as linear, linear splits are preferably used. Instead of partitioning the data into two subsets, the decision tree uses M (preferably having a default value of 4) sub-nodes to indicate the linear relationship. FIG. 13 shows an example of a linear split 92 at the bottom split level for a continuous variable DATE@ PROCESS STEP=062, in which M equals the default value of 4. Since a continuous linear split appears different from the binary split shown in FIG. 11, the user can immediately identify the relationship as linear. At the same time, the linear split rule is the result of a fitted regression line. By generating M sub-nodes simultaneously, the yield management system and method in accordance with the present invention eliminate the need for splitting on X repeatedly, as would be the result in the case of a multiple level decision tree employing plural instantiations of a binary split rule.

The range split method in accordance with one embodiment of the present invention operates as follows. It is quite common for the optimal value of a parameter to produce the best yield results in the middle of its range. A deviation from the optimal value in a positive or negative way typically causes yield loss. This type of situation may be best modeled using a split rule of the form $a1 \leq x < a2$, referred to as a range type split.

Figure 14:
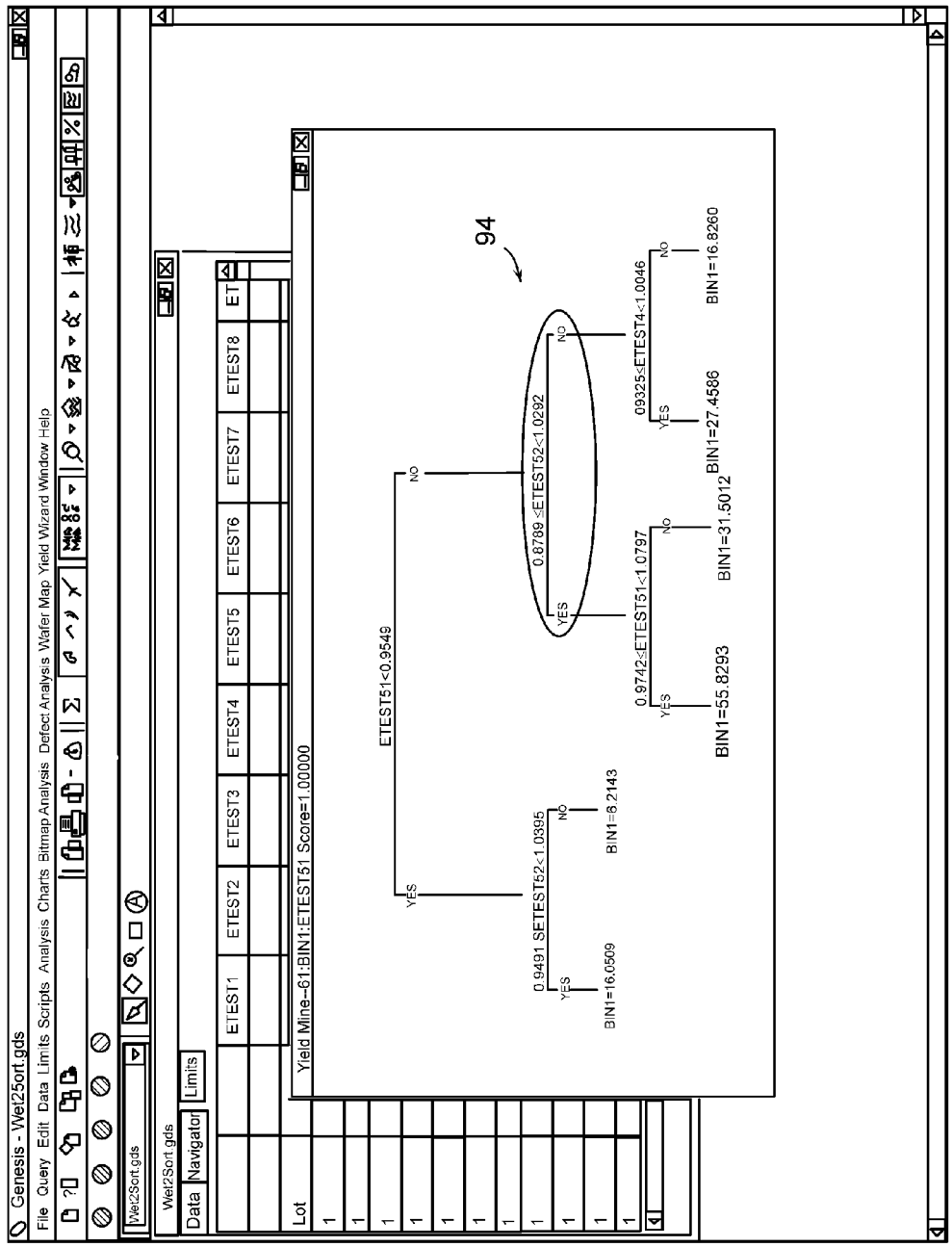
FIG. 14 illustrates an example of a yield parameter being selected by the user and a decision tree node being built based on a range type split in accordance with another embodiment of the method of the present invention.

FIG. 14 shows an example of applying a range split rule. In the situation in which the best results are obtained when a parameter is in the middle of its range, the range split rule generates a more accurate model than a traditional decision tree binary split rule of the form X<a. In the example shown in FIG. 14, the split rule for the continuous variable ETEST52 is $0.8789 \leq \text{ETEST}52 < 1.0292$ and generates a range split 94. At the same time, by spanning the two extremes of the range of the variable, the range split rule enhances the significance of the variable and makes its impact easier to discern.

Various embodiments of the semiconductor yield management system and method in accordance with the present invention preferably provide a plurality of additional methods to facilitate node splitting for construction of the decision tree. By way of background, semiconductor process data sets may vary substantially from one to another. A given parameter, which the user is attempting to use as a prediction variable to construct the decision tree, may exhibit different values among data sets. At the heart of the model building is the split rule which partitions a node into sub-nodes. By controlling the way split rules are formulated, the user may assure that more appropriate and accurate models are generated.

The semiconductor yield management system and method in accordance with the present invention preferably provide user control in formulating the rules for splitting nodes, including the following split rule methods: 1) consider tool and date parameters jointly; 2) consider tool and event parameters jointly; 3) maximize class distinction; 4) prefer simple splits; 5) minimum purity; 6) parameter weighting; 7) minimum group size; 8) maximum number of descendants; and 9) raw data mapping. These user selectable controls for formulating split rules are powerful tools in practice. They will now be described in detail. Now, the method for considering tool and date parameters jointly for splits in accordance with one embodiment of the present invention will be described.

Many data sets contain data respecting process tool designations as categorical values, as well as the times when the tools are used as continuous values. A common cause for yield problems may be associated with the use of a single tool. For example, the tool may be in proper operating condition at the beginning of a period during which data is collected. However, after a certain date during the period, a change in the tool operation causes the yield to drop. An accurate model to describe the above case involves splitting on both the tool and date parameters. However, for speed and practical considerations, most splits in conventional semiconductor yield management systems consider only one parameter at a time. To solve this problem, the semiconductor yield management system and method in accordance with one embodiment of the present invention provide a method, preferably available as an option for selection by the user, to consider tool and date parameters jointly for splits. This type of decision tree structure requires the semiconductor yield management system and method to look ahead one level when they are considering the split on the tool parameter.

To select the method for considering tool and date parameters jointly for splits, the user positions the mouse pointer on a "Consider tool and date jointly for splits" check box 200 shown in FIG. 8 and clicks the left mouse button. When the consider tool and date jointly for splits method is invoked, the semiconductor yield management system and method in accordance with one embodiment of the present invention not only consider each parameter, but also the tool parameter and its corresponding date parameter together as a split candidate. Because a joint split involves two parameters, the relative score for the joint split versus other splits is adjusted by a threshold.

FIG. 13 shows an example of a joint split 202, as indicated by the "YES-AND" connector between the top and intermediate split levels of the decision tree. When a joint split rule is being employed, the joint split rule may also be color-coded. For example, a green color for the split rule may indicate the split is a joint split. Now, the method for considering tool and event parameters jointly for splits in accordance with one embodiment of the present invention will be described.

In accordance with one embodiment of the semiconductor yield management system and method of the present invention, the user may select a scenario to produce a joint split on a tool parameter and one or more events related to use of that tool. For example, a tool may be tested for its particle counts using a test wafer periodically, such as on a daily basis. Because high particle counts can cause yield loss, periodically obtaining particle counts for the tool provides useful information. To identify this type of problem, a joint split on the tool and one or more related events, such as particle count measurements, is appropriate.

Accordingly, similar to the earlier described method for considering tool and date parameters jointly for splits, the semiconductor yield management system and method in accordance with one embodiment of the present invention provide a method, preferably available as an option for selection by the user, to consider tool and related event parameters jointly for splits. Thus, the model considers more than one parameter at a time by considering the tool and a related event measurement together.

To select the method for considering tool and related event parameters jointly for splits, the user positions the mouse pointer on a "Consider tool and event jointly for splits" check box 150 shown in FIG. 8 and clicks the left mouse button. When the consider tool and event jointly for splits method is invoked, the semiconductor yield management system and method in accordance with one embodiment of the present invention not only consider each parameter, but also the tool parameter and its related event parameter together as a split candidate. Because a joint split involves two parameters, the relative score for the joint split versus other splits is adjusted by a threshold. One distinction compared to the earlier described method for considering tool and date parameters jointly is the tool may be associated with multiple events. In this case, the semiconductor yield management system and method in accordance with one embodiment of the present invention will consider pairing the tool parameter with each event measurement when building the model. Now, the method for maximizing class distinction for splits in accordance with one embodiment of the present invention will be described.

When a response variable is categorical, sometimes the user would like to build a model based on a particular class of the response variable, for example, the class corresponding to lots with bad yield. To accomplish the building of the model, the semiconductor yield management system and method in accordance with one embodiment of the present invention provide a method, preferably available as an option for selection by the user, to select a method to maximize class distinction to produce splits.

To select the method for maximizing class distinction, the user positions the mouse pointer on a "Maximize Class Distinction" check box 160 shown in FIG. 8 and clicks the left mouse button. To select a class, the user additionally positions the mouse pointer on a "Class" box 162 and clicks the left mouse button. The class or classes that are available for selection by the user appear in a scroll-down list in the "Class" box 162, as shown in FIG. 8.

When the maximize class distinction method is invoked, the semiconductor yield management system and method in accordance with the present invention build a model based on splits that provide the greatest distinctions of the class selected by the user. For example, suppose a data set contains 100 "good" lots and 20 "bad" lots. A split, S, partitions the data set into two subsets. The first subset contains 90 "good" lots and 18 "bad" lots. The second subset contains 10 "good" lots and two "bad" lots. This type of split generally does not receive a high score from the semiconductor yield management system, because the distribution of "good" lots and "bad" lots is the same, namely, a 5:1 ratio for each subset. When the maximize class distinction method is invoked, and the user selects the "bad" lots as the class, the previous split receives a high score, because the system is now concentrating on splitting the "bad" lots, and the split produces a separation of 18 to two, which increases the ratio to 9:1. Now, the method for preferring simple splits in accordance with one embodiment of the present invention will be described.

When the prediction variable is a categorical variable with k classes, the number of possible splits is $2^{(k-1)}-1$. For example, if a parameter has the following eight classes, {A, B, C, D, E, F, G, H}, the following are three of the 127 possible splits:

1) {A} vs. {B, C, D, E, F, G, H}
2) {A, D} vs. {B, C, E, F, G, H}
3) {C, D, F, G} vs. {A, B, E, H}

If the top split is selected, it means using A matters in the outcome. If the bottom split is selected, it means {C, D, F, G} as a group is different from {A, B, E, H} as a group.

Now, let $N_1$ and $N_2$ denote the number of classes in each of the two subsets of each exemplary split shown above. Let $N=\min(N_1, N_2)$. In the above example, the N values are 1, 2, and 4, respectively, for the three splits shown. In practice, splits with smaller N values are simpler to conceptualize than those with greater N values. Therefore, a split with a small N value may be referred to as a simple split. If the user decides that a simple split is more likely to define an accurate model, and therefore wants to attribute more weight to that type of split, he or she may select the method to prefer simple splits.

When the user selects the method to prefer simple splits, the user is preferably provided with a range of selections from "Never" prefer simple splits to "Always" prefer simple splits, provided by a radio dial box 204 shown in FIG. 8. The user may position the mouse pointer at a selected location in the radio dial box 204 and click the left mouse button to enter his or her preference for simple splits. On the one hand, "Never" prefer simple splits means all splits are treated equally. On the other hand, "Always" prefer simple splits weights simple splits, so that essentially only splits with N values of 1 are considered. Now, the method for specifying minimum purity in accordance with one embodiment of the present invention will be described.

If a node is pure (i.e., all the cases in the node have the same response $A_j$), then, $f(T)=A_j$. Otherwise, the node is not pure.

When the response variable is a categorical variable, each terminal node of the decision tree has its own response variable distribution. For example, if the response variable contains two classes, A and B, a terminal node consisting of 100 cases may have 70 cases belonging to class A, and the remaining 30 belonging to class B. Consequently, the distribution for this terminal node is {0.7, 0.3}. In some situations, the user may only be interested in a model which will show a high concentration of a certain class, for example, more than 90% of the cases must belong to class A. To achieve this result, the semiconductor yield management system and method in accordance with one embodiment of the present invention provide a method, preferably available as an option for selection by the user, to specify minimum purity.

When the user selects the minimum purity method, the user chooses a class of interest and sets a threshold for the chosen class. In order to set a threshold, the user positions the mouse pointer on a "Minimum Purity (%)" box 206 shown in FIG. 8 and clicks the left mouse button. The user enters a purity value as a percentage by positioning the mouse pointer on the up/down arrows adjacent the "Minimum Purity (%)" box 206 and clicking the left mouse button to select the threshold value, or by entering a value in the box using the numerical keys on the keyboard 20. The user also positions the mouse pointer on the "Purity Class" box 208 shown in FIG. 8 and clicks the left mouse button and highlights the chosen response variable in a scroll-down list that appears. For example, the response variable may contain two classes, "good yield" and "bad yield". The user can select "bad yield" as the class of interest and a threshold value 80%. In this case, the semiconductor yield management system and method in accordance with the present invention consider a split valid if and only if at least one of the sub-nodes from the split has a distribution of more than 0.8 in the "bad yield" class. Now, the method for parameter weighting in accordance with one embodiment of the present invention will be described.

The knowledge of a user respecting what types of parameters are the likely cause of a yield problem may be helpful in building the correct model. In order to facilitate incorporating the knowledge of the user respecting the significance of various parameters, the preferred embodiment of the semiconductor yield management system and method in accordance with the present invention additionally provides a method, preferably available as an option for selection by the user, to weight one or more parameters.

Figure 15:
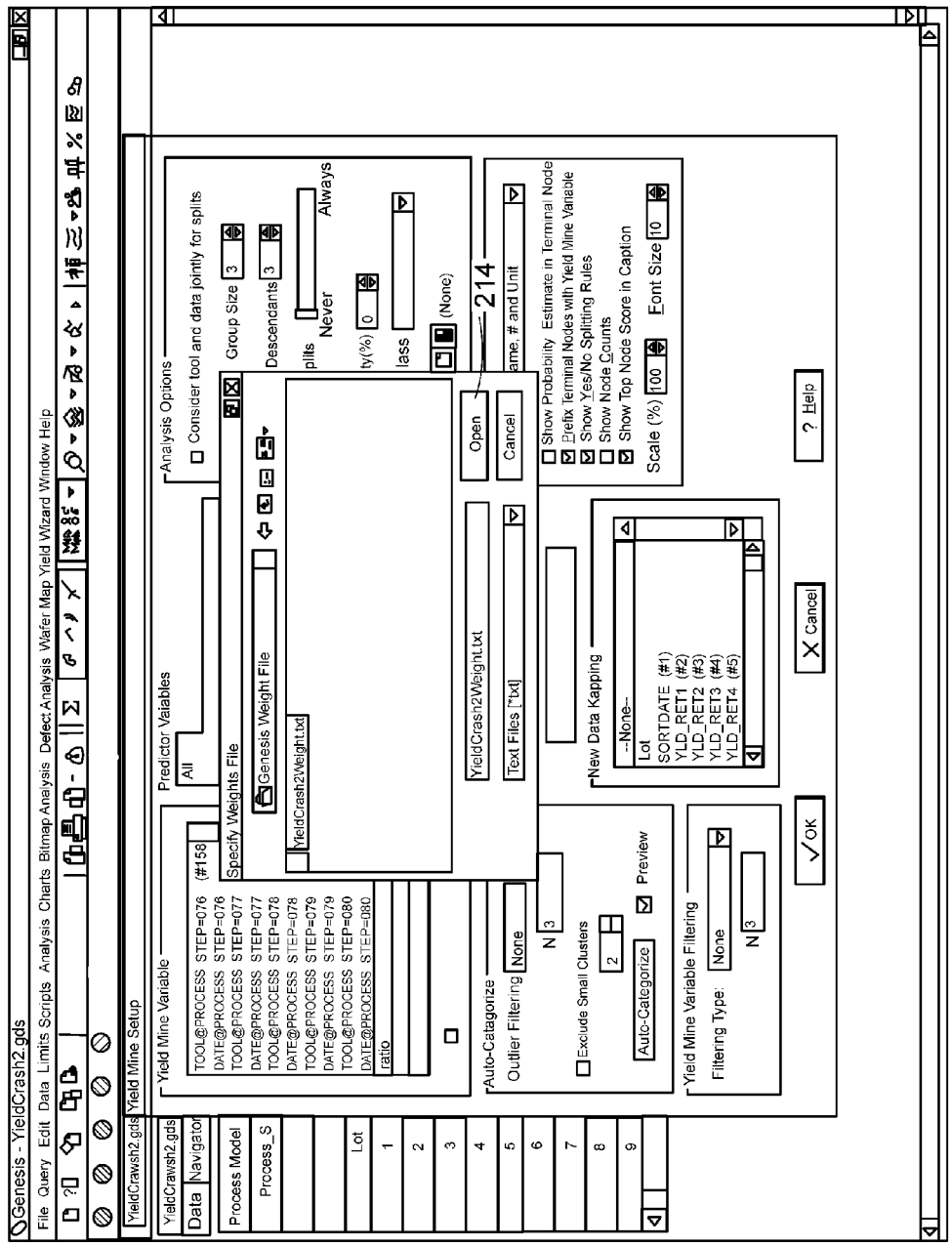
FIG. 15 illustrates a window provided for the user to weight parameters in accordance with another embodiment of the method of the present invention.

The user selects the parameter weighting method by positioning the mouse pointer on a "Weighting File" button 212 shown in FIG. 8 and clicking the left mouse button to cause the overlying window shown in FIG. 15 to appear. The user may set a weight for each parameter in each text file that appears in the window shown in FIG. 15. The semiconductor yield management system and method in accordance with the present invention preferably set the default weight value to 1. In this way, the user only needs to adjust parameters with weights different from 1.

When the user invokes the parameter weighting method, the user may highlight a parameter by positioning the mouse pointer on the parameter appearing in the overlying window shown in FIG. 15 and clicking the left mouse button. The user next positions the mouse pointer on an "Open" button 214 and then clicks the left mouse button to open the parameter file. In the text file for the parameter, each line preferably has the following format:

Weight X Pattern, where:

Weight is a real value;

X is either R (a regular expression) or S/s (substring matching, with S for case insensitive and s for case sensitive); and Pattern is the string which the parameter names are matched against.

An example of parameter weighting is as follows:

2 R tool

The above expression means that all parameters containing the string "tool" have a weight of 2. When the semiconductor yield management system and method in accordance with the present invention determine which variable to split, they calculate an internal score for each parameter based on its statistical significance. Then, this score is multiplied by its weight to obtain its overall score. Preferably, the parameter with the highest overall score is determined to be the split parameter. Now, the method for specifying minimum group size in accordance with one embodiment of the present invention will be described.

Typically, a node is split when results of the partition produce two sub-nodes with significantly different response variable distributions. However, a split may have little practical value when the number of cases in the node is below a predetermined threshold. The semiconductor yield management system and method in accordance with a preferred embodiment of the present invention enable a user to set this threshold using a method, preferably available as an option for selection by the user, to specify minimum group size.

In order to invoke the minimum group size method, the user positions the mouse pointer on a "Minimum Group Size" threshold entry box 216 shown in FIG. 8. The user positions the mouse pointer on the up/down arrows and clicks the left mouse button, or enters a value in the box 216 using the numerical keys on the keyboard 20, to select the threshold value. When a node contains fewer cases than the selected threshold value, no following split is considered. This maintains the output clean and saves time in building the model. Now, the method for specifying the maximum number of descendants in accordance with one embodiment of the present invention will be described.

In the majority of real cases, yield loss is typically caused by a single factor. The top split is generally the most important split. A user may not care about splits after a predetermined split level. In order to control the number of split levels in building the model, the preferred embodiment of the semiconductor yield management system and method in accordance with the present invention provides a method, preferably available as an option for selection by the user, to specify the maximum number of descendants.

The user invokes the method for specifying the maximum number of descendants by positioning the mouse pointer on a "Maximum # of Descendants" cut-off level entry box 218 shown in FIG. 8. The user positions the mouse pointer on the up/down arrows and clicks the left mouse button, or enters a value in the box 218 using the numerical keys on the keyboard 20, to select the predetermined cut-off level. During model building, when the decision tree reaches the predetermined cut-off level, no additional subsequent splits are generated. Now, the method for enabling raw data mapping in accordance with one embodiment of the present invention will be described.

Occasionally, data are binned before a model is built. However, a user may want to validate the model results with the raw data, instead of the binned data, in the follow-up analysis. One embodiment of the semiconductor yield management system and method in accordance with the present invention provides a method, preferably available as an option for selection by the user, to enable raw data mapping.

The user selects one or more variables for raw data mapping by highlighting the variables in a "Raw Data Mapping" scroll-down list 220 shown in FIG. 8 by positioning the mouse pointer on each selected variable and clicking the left mouse button. When the user invokes the raw data mapping method, the binned variable, which is treated as a categorical variable, is linked to its original form. This enables the user to plot the variable as a continuous variable, and examine its correlation with a continuous prediction variable using analysis tools, such as regression, or the like.

The various embodiments of the yield management system and method in accordance with the present invention also provide several additional methods for selection by a user. The first method provides a split rule referred to as the new cut rule method, and the second method is used in model building and is referred to as the generate multiple models simultaneously method. These two methods will now be described in detail, beginning with the new cut rule method.

Figure 16:
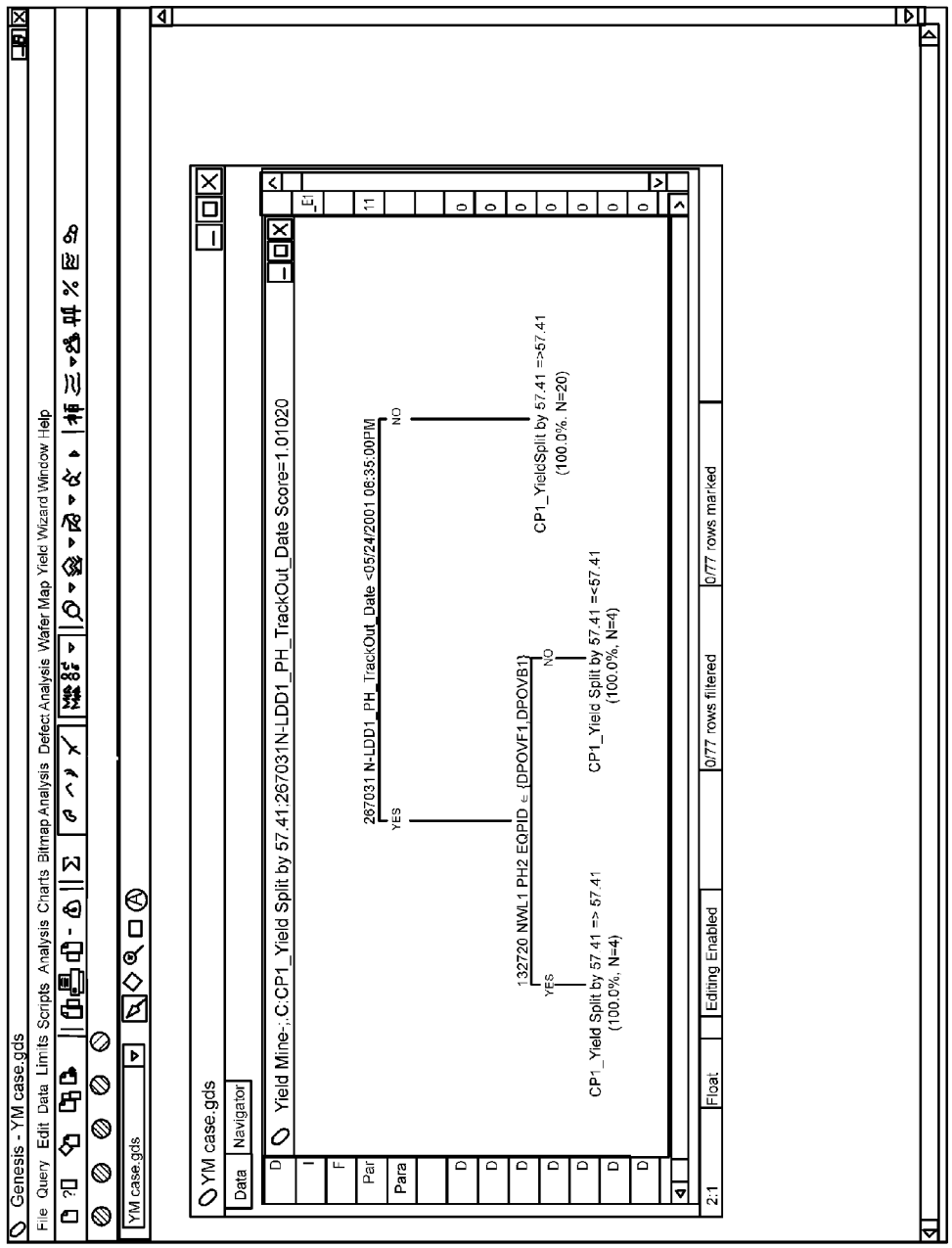
FIG. 16 illustrates an example of a yield parameter being selected by the user and a decision tree node being built based on a binary split in accordance with one embodiment of the method of the present invention.

By way of background, once a parameter is identified as the split parameter, the split rule produced by conventional yield management systems is typically based on statistical significance. Underlying each yield problem, there is a real cause. Occasionally, the split rule produced by conventional yield management systems may be inaccurate due to noise present in the data. For example, FIG. 16 shows a binary split at the node "267031 N-LDD1_PH_TrackOut_Date <May 24, 2001 06:35:00 PM". Assume, however, that the user has knowledge that the tool was maintained on "May 25, 2001". Consequently, it is probable that the problem actually occurred on the maintenance date. The yield management system and method in accordance with the present invention preferably enable the user to adjust the model using the new cut rule method.

Figure 17:
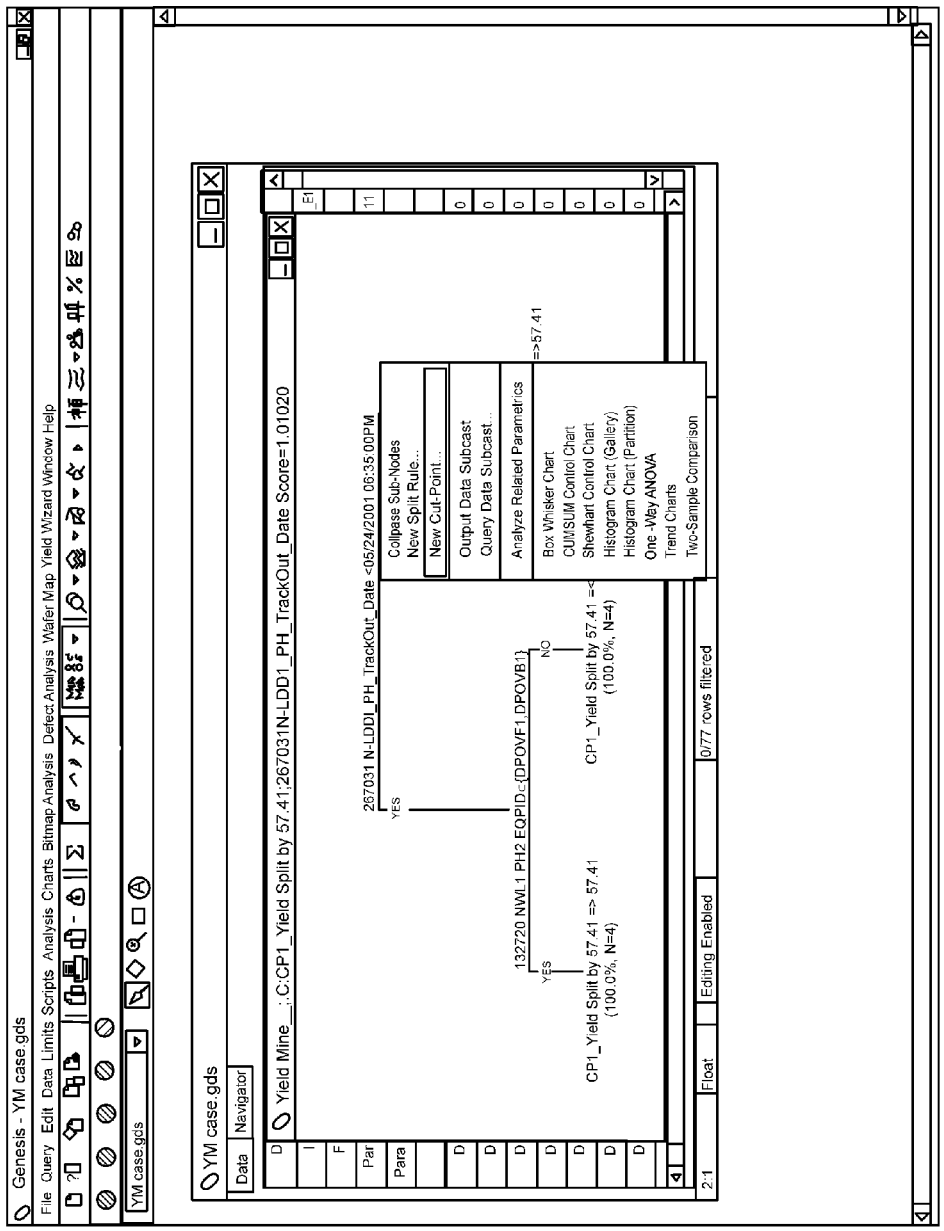
FIG. 17 illustrates a pop-up menu that appears when the user positions a mouse pointer on a yield parameter and clicks the left mouse button to invoke a new cut rule method in accordance with another embodiment of the method of the present invention.
Figure 18:
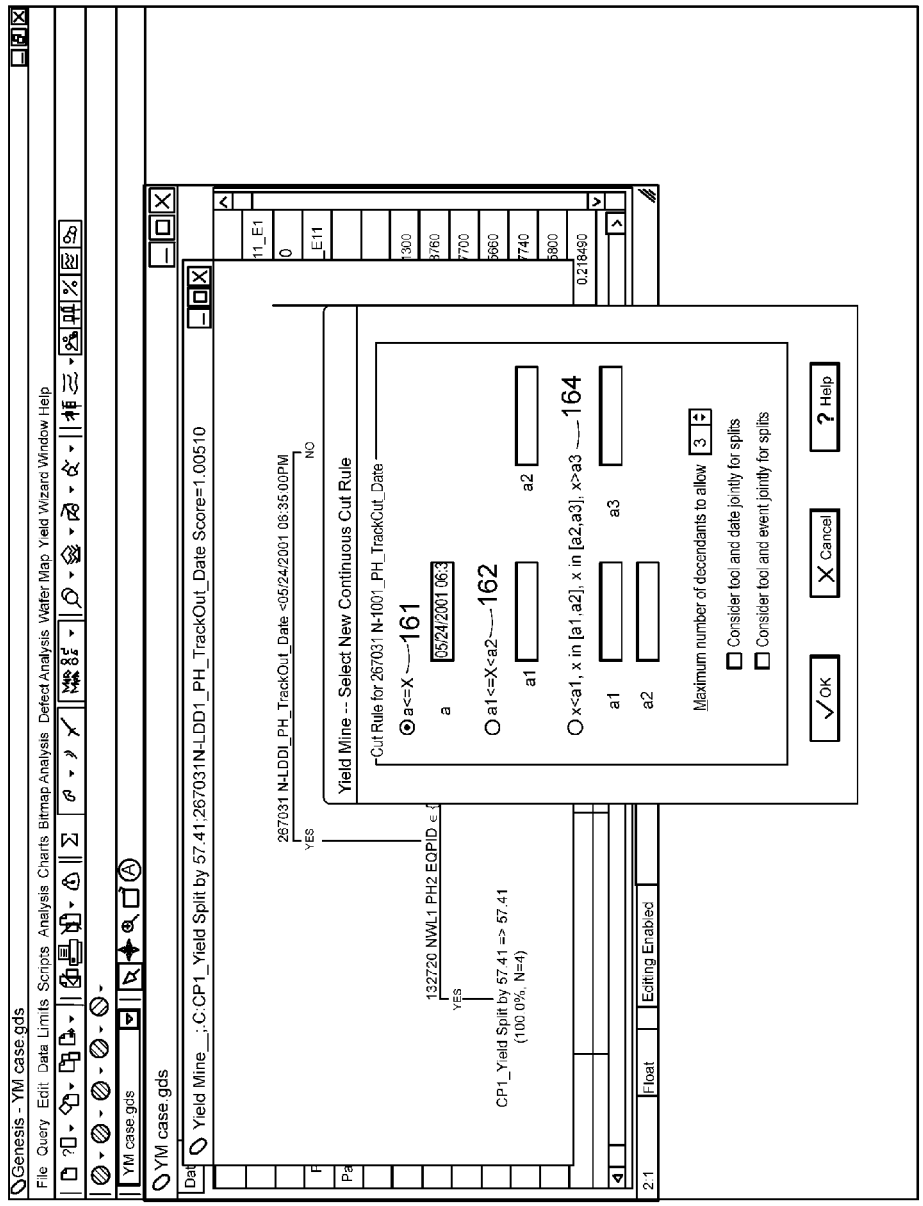
FIG. 18 illustrates a window that appears when the user positions a mouse pointer on "New Cut-Point" shown in FIG. 17 and clicks the left mouse button to select a split format for a continuous prediction variable.

In order to invoke the new cut rule method, the user positions the mouse pointer on the displayed split rule, for example, "267031 N-LDD1_PH_TrackOut_Date <May 24, 2001 06:35:00 PM" shown in FIG. 16, and clicks the left mouse button to pop up the menu shown in FIG. 17. As shown in FIG. 17, the pop-up menu includes a selection labeled "New Cut-Point". The user positions the mouse pointer on "New Cut-Point" and clicks the left mouse button to display the window shown in FIG. 18.

Figure 19:
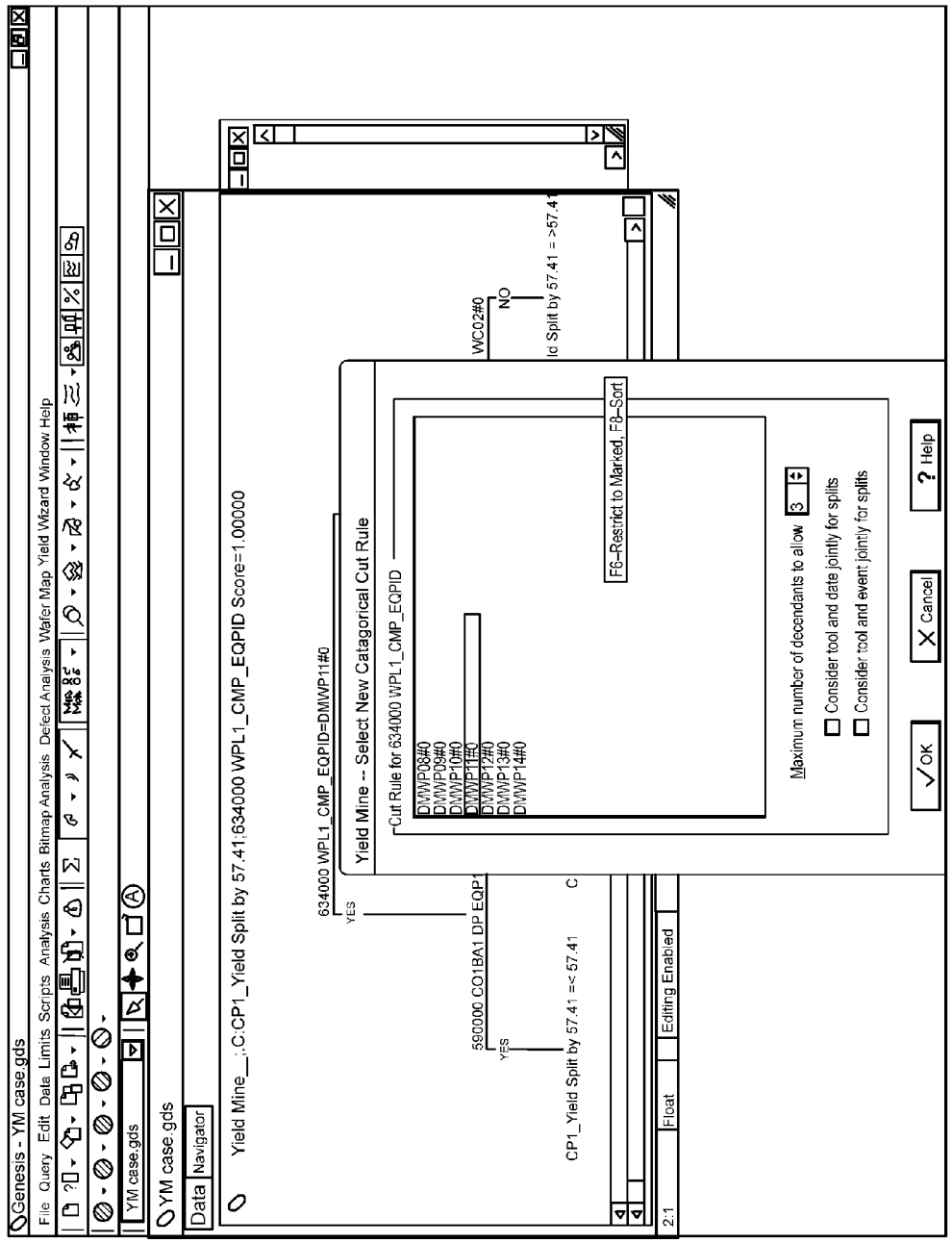
FIG. 19 illustrates a window that appears when the user positions a mouse pointer on "New Cut-Point" shown in FIG. 17 and clicks the left mouse button to select a combination of classes for a categorical prediction variable.

When the user invokes the new cut rule method, the format of the split rule depends on whether the prediction variable is continuous or categorical. On the one hand, if the prediction variable is continuous, there are three types of split formats from which the user may select. The available split formats are 1) a default type ($a \leq X$), as indicated by the numeral 161 shown in FIG. 18; 2) a range type ($a1 \leq x \leq a2$), as indicated by the numeral 162 shown in FIG. 18; and 3) a linear type (X<a1, X in [a1, a2], X in [a2, a3], X>a3), as indicated by the numeral 164 shown in FIG. 18. These different split formats facilitate the user being able to produce an accurate model. On the other hand, if the prediction variable is categorical, when the user positions the mouse pointer on the "New Cut-Point" selection and clicks the left mouse button, the window shown in FIG. 19 is displayed. The user may select any combination of classes of the variable and include them in one sub-node. The remainder of the data is included in the other sub-node.

Figure 20:
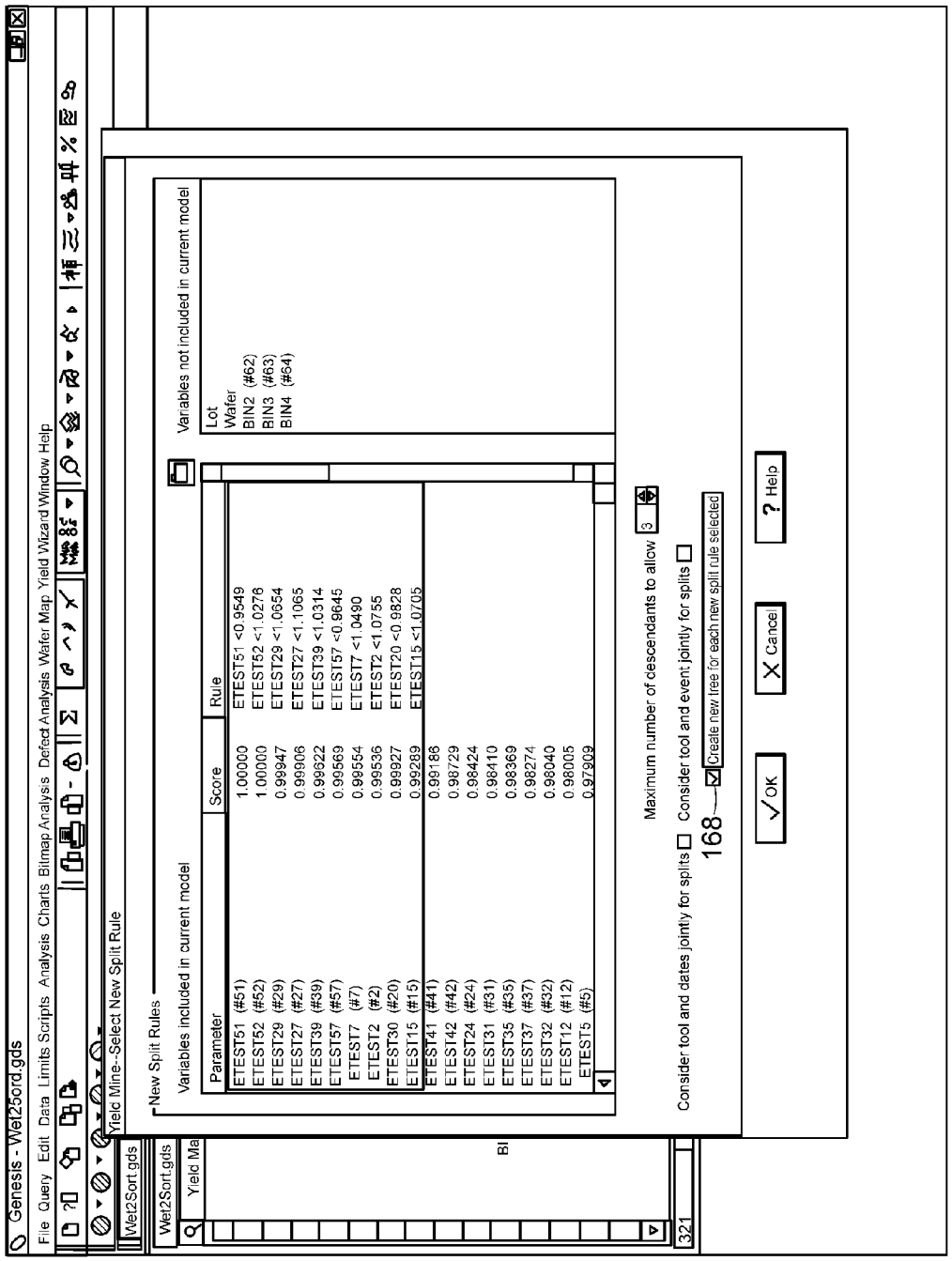
FIG. 20 illustrates a window that appears when the user positions a mouse pointer on "New Split Rule" shown in FIG. 17 and clicks the left mouse button to display the split rules for the top N scored parameters.

Referring again to FIG. 17, another selection in the pop-up menu is "New Split Rule". The user positions the mouse pointer on "New Split Rule" and clicks the left mouse button to display the window shown in FIG. 20. When the user selects a new split rule, the split rules for the top N scored parameters are displayed in the new split rule setup screen, as shown in FIG. 20.

Figure 21:
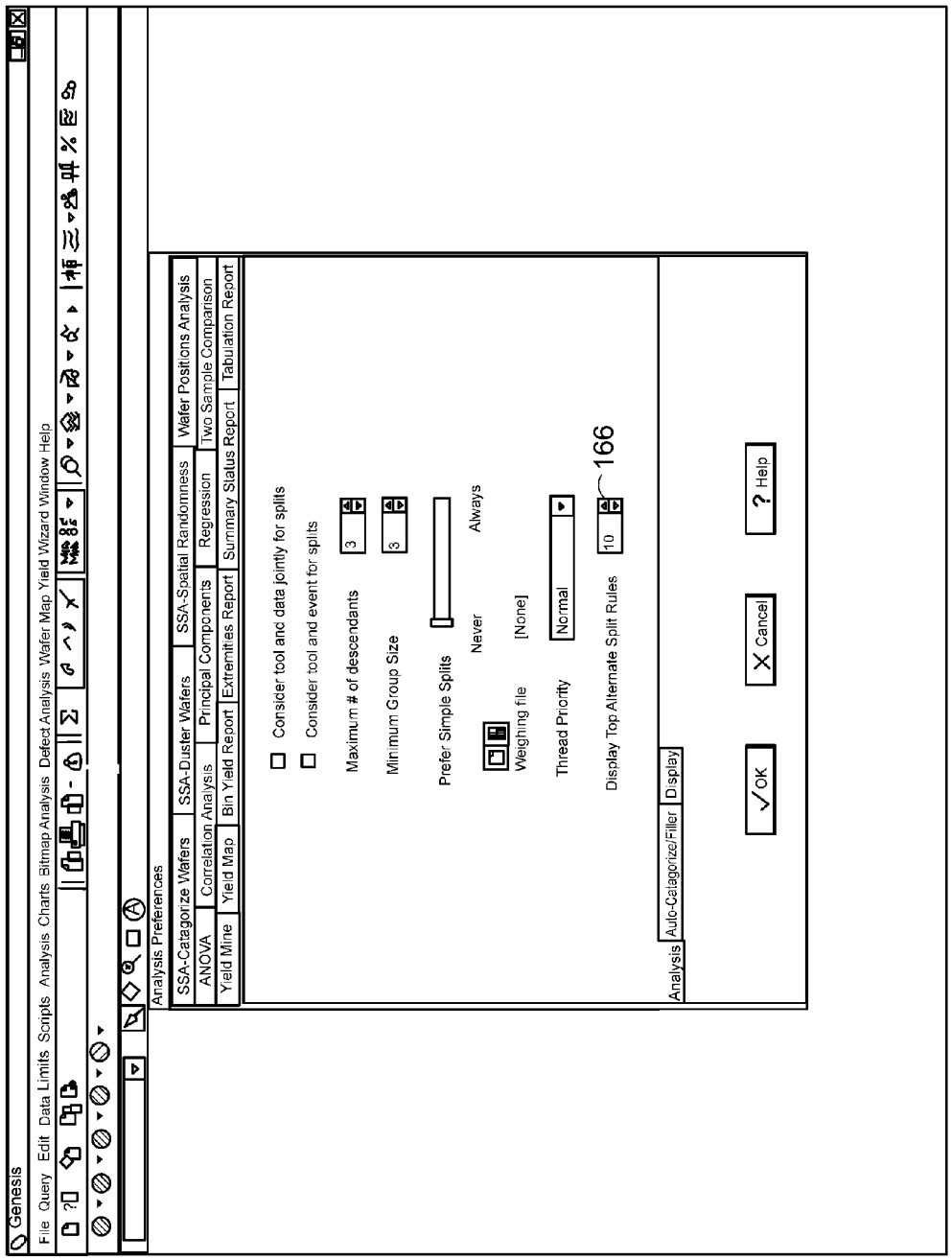
FIG. 21 illustrates a window to select a number, N, of the split rules for the top N scored parameters shown in FIG. 20.

The user may select the number of alternate split rules to be displayed from the setup screen shown in FIG. 8 by selecting Edit→Edit preferences→Analysis→YieldMine to display the window shown in FIG. 21. If the user elects to have the split rules for a different number of the top scored parameters displayed, the user positions the mouse pointer on a "Display Top Alternate Split Rules" box 166 shown in FIG. 21 and clicks the left mouse button. The user enters a number for the top N scored parameters for which the split rules are to be displayed by positioning the mouse pointer on the up/down arrows adjacent the "Display Top Alternate Split Rules" box 166 and clicking the left mouse button to enter a number, or by entering a number in the box using the numerical keys on the keyboard 20, to select the number of the top scored parameters to be displayed to provide the user a quick view of the alternative splits without having to build new decision trees based on those parameters.

When a terminal node is reached following application of all of the split rules, a value or a class, f(T), is assigned to all cases in the node depending on the type of the response variable. If the type of the response variable is numerical, f(T) is a real value number. Otherwise, f(T) is set to be a class member of the set $A=\{A_1, A_2, \ldots, A_k\}$.

There are situations in which the cause of a yield problem is not readily apparent, so the user wants to investigate more than one parameter to determine which parameter is the cause of the yield problem. In this case, the user may invoke the method to generate multiple models simultaneously, so that the yield management system and method in accordance with one embodiment of the present invention build more than one model.

Figure 22:
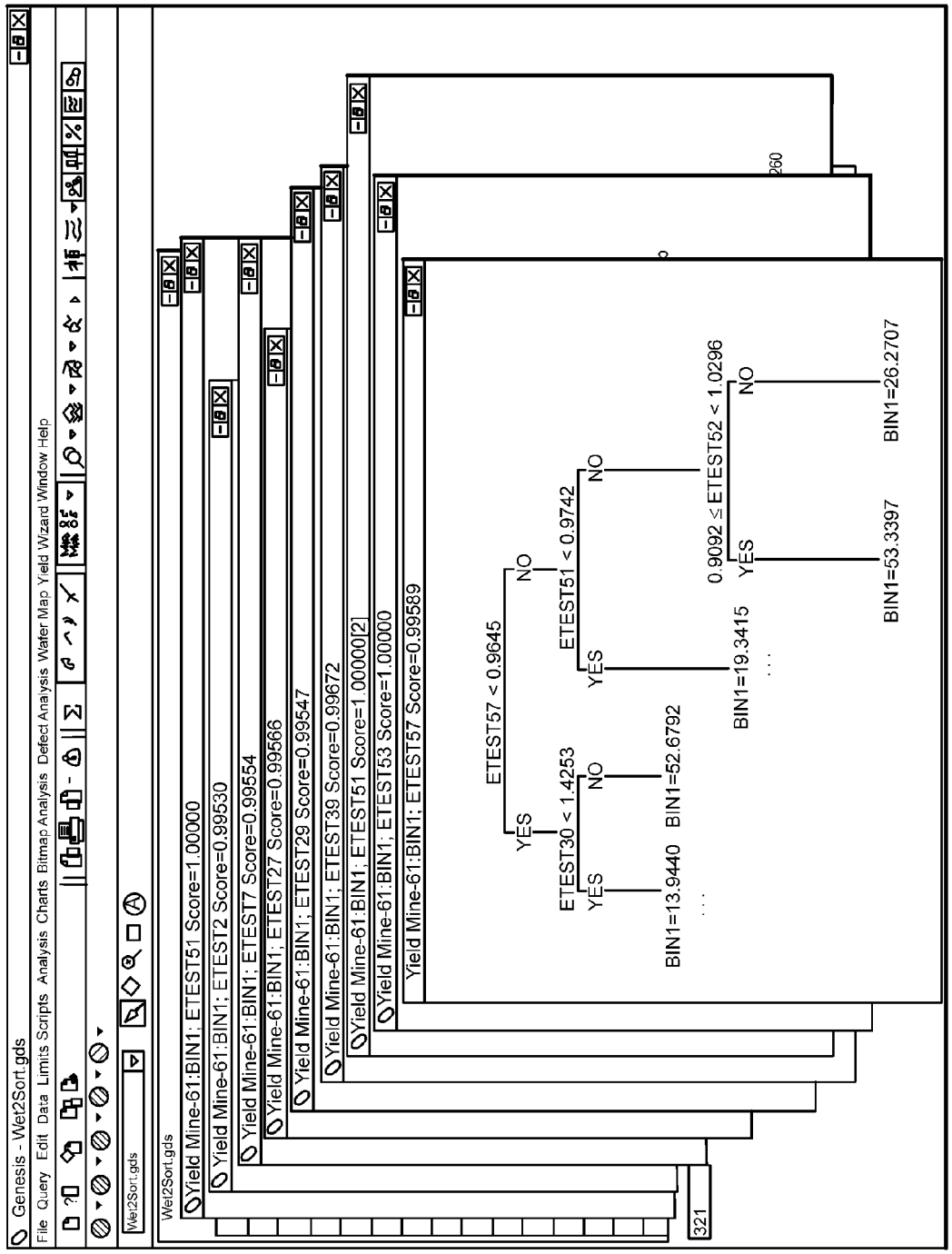
FIG. 22 illustrates an example of various yield parameters being selected by the user and decision trees being built to generate multiple models simultaneously in accordance with one embodiment of the method of the present invention.

In order to invoke the generate multiple models simultaneously method, the user positions the mouse pointer on "New Split Rule" in the pop-up menu shown in FIG. 17 and clicks the left mouse button to display the window shown in FIG. 20. The user may choose a group of parameters for the model building by highlighting the selected parameters in the scroll-down list shown in FIG. 20. The user also positions the mouse pointer on the "Create new tree for each new split rule selected" box 168 shown in FIG. 20 and clicks the left mouse button. The yield management system and method in accordance with one embodiment of the present invention then generate a model for each of the parameters selected by the user. FIG. 22 shows an example of the results. Consequently, instead of building one model at a time, the yield management system and method in accordance with one embodiment of the present invention produce a plurality of models if the user has invoked the generate multiple models simultaneously method.

Additional embodiments of the yield management system and method in accordance with the present invention enable the user to select various input/output methods, including a redisplay setup window method and collapse/expand sub-nodes methods, for convenience. These input/output methods will now be described in more detail, beginning with the redisplay setup window method.

Figure 23:
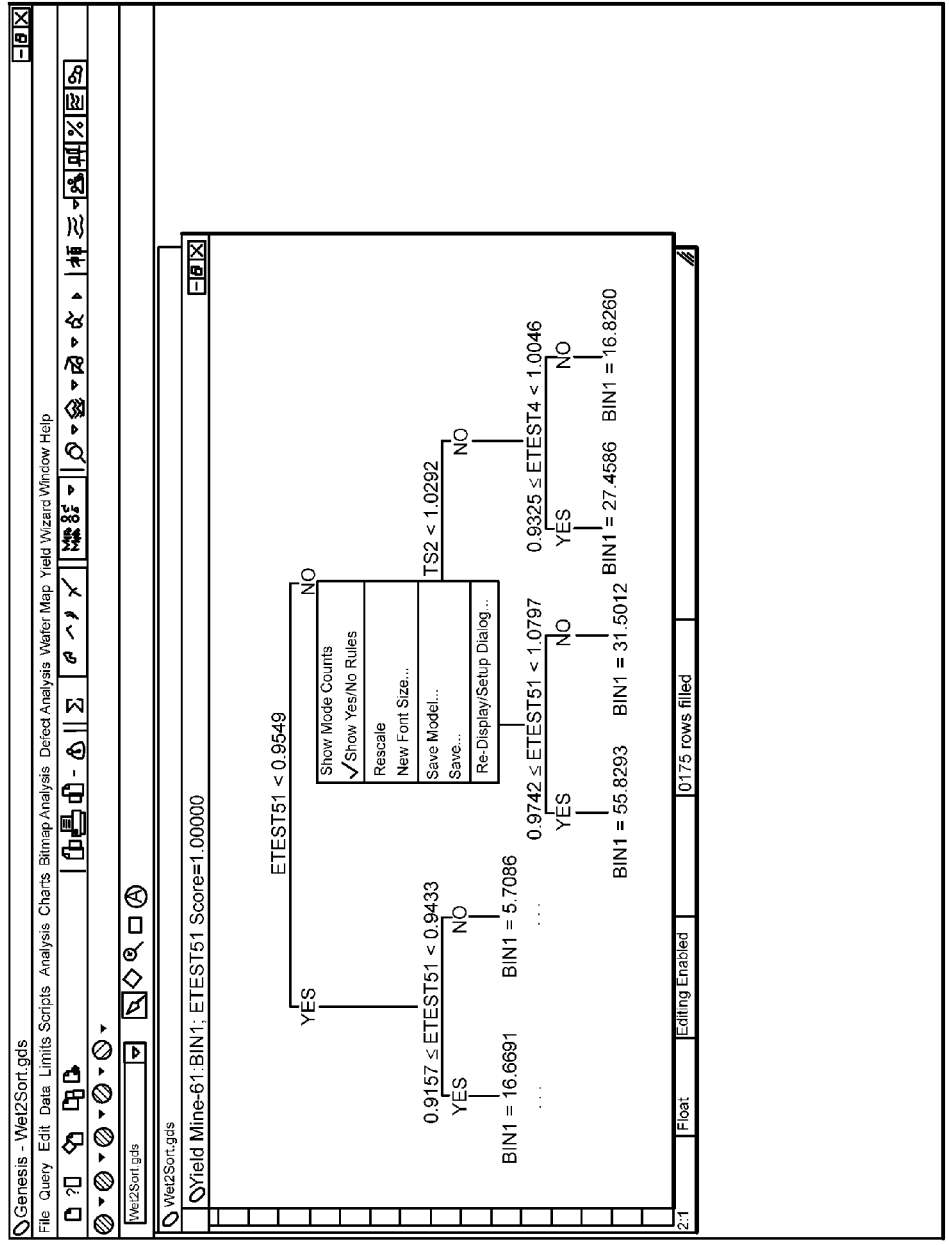
FIG. 23 illustrates a pop-up menu which enables the user to elect to modify setup selections in accordance with one embodiment of the method of the present invention.

Occasionally, setting up all of the options and selecting all of the prediction variables from a data set on which the yield management system and method in accordance with one embodiment of the present invention build the model is time consuming. In order to invoke the redisplay setup window method, the user positions the mouse pointer on the display and clicks the right mouse button to pop up the menu containing "Re-display Setup Dialog" shown in FIG. 23. The user positions the mouse pointer on "Re-Display Setup Dialog" and clicks the left mouse button to display the window shown in FIG. 8. If the user then decides to modify the setup, instead of requiring the user to enter all of the requisite selections again, one embodiment of the yield management system and method in accordance with the present invention enables the user to quickly modify his or her previous selections.

Figure 24:
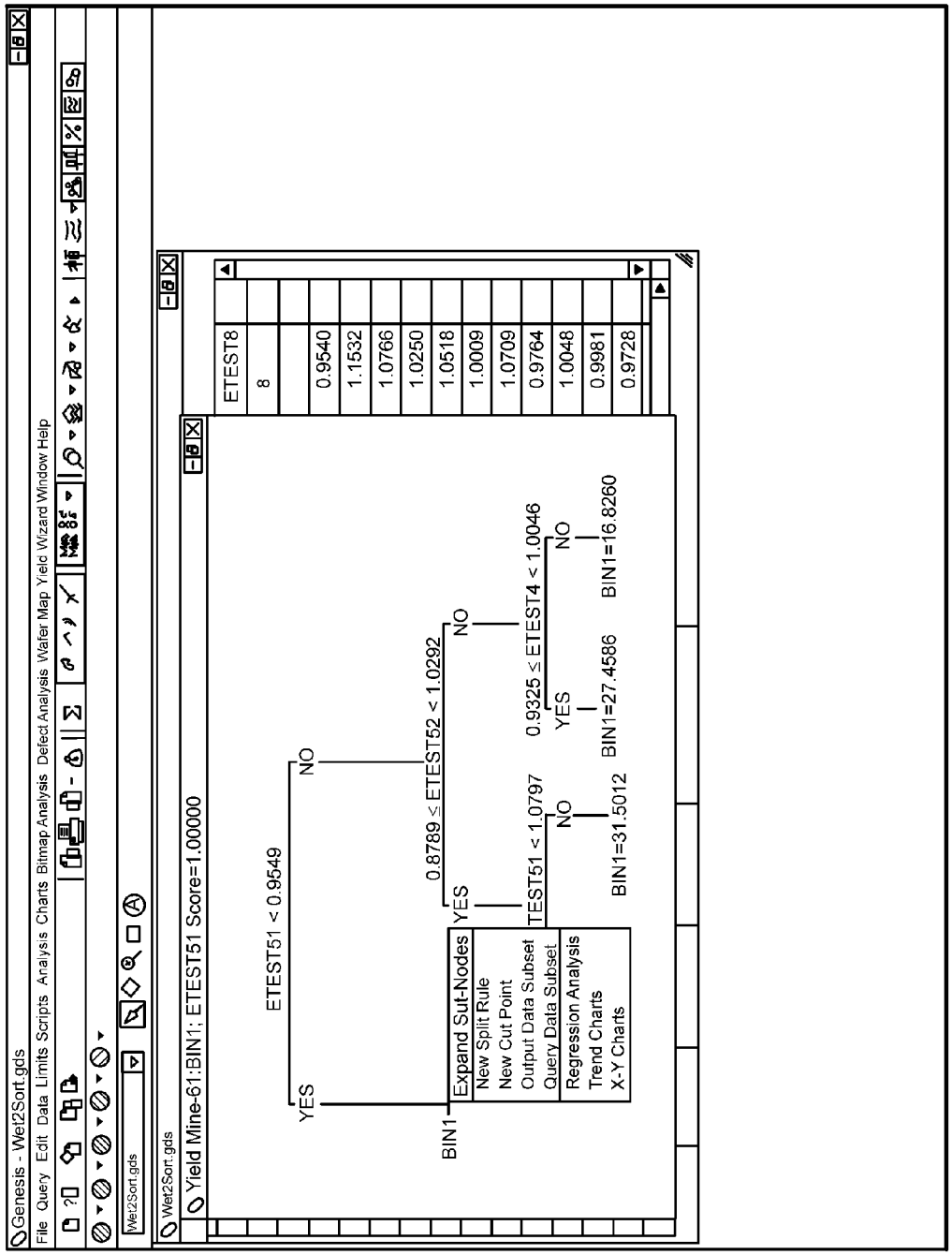
FIG. 24 illustrates a pop-up menu which toggles to "Expand Sub-Nodes" when the "Collapse Sub-Nodes" method is invoked by the user in accordance with another embodiment of the present invention.

Finally, another embodiment of the yield management system and method in accordance with the present invention preferably enables every node on the decision tree to be collapsed. Referring again to FIG. 17, another menu selection in the pop-up menu is "Collapse Sub-Nodes". In order to invoke the "Collapse Sub-Nodes" method, the user positions the mouse pointer on "Collapse Sub-Nodes" and clicks the left mouse button. After the user selects the "Collapse Sub-Nodes" method, the menu selection automatically toggles to "Expand Sub-Nodes", as shown in FIG. 24. Preferably, the user can collapse or expand a node from the decision tree output by simply clicking on the node and selecting the "Collapse/Expand Sub-Nodes" methods. The user may invoke the "Collapse/Expand Sub-Nodes" methods to collapse the node when the user decides that the split of the node is unnecessary or, alternatively, to expand the node when the user wants to examine the aggregate statistics of the entire subset. The "Expand Sub-Nodes" method may also be invoked by the user to expand a previously collapsed node, so that the node returns to its original length.

Figure 25:
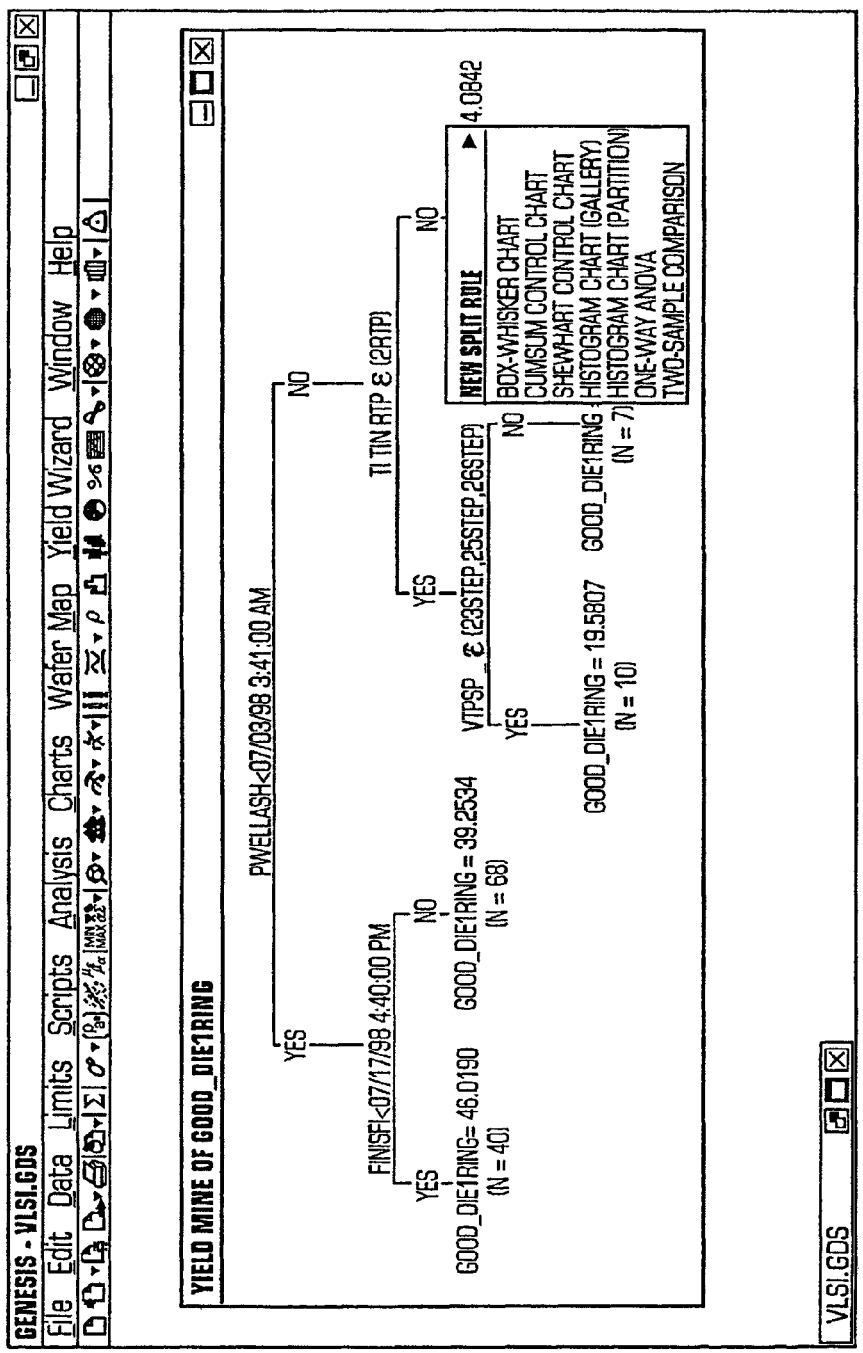
FIG. 25 illustrates an example of statistical tools available to the user in accordance with one embodiment of the present invention.

Preferably, statistical analysis tools are available to help the user to validate the model and identify the yield problem. At each node, a right click of the mouse 22 shown in FIG. 1 produces a list of available analysis tools in a window, as shown in FIG. 25. Every analysis is done at the node level (i.e., it only uses the data from that particular node). An example of the analysis tools available at the right node after the first split is shown in FIG. 25. In this example, those analysis tools may include box-whisker chart, Cumsum control chart, Shewhet control chart, histogram, one-way ANOVA, two sample comparison, and X-Y correlation analysis, which are well-known to persons skilled in the art. The particular tools available to the user depend upon the nature of the X and Y parameters (e.g., continuous versus categorical).

After each model is built, the decision tree can be saved for future predictions. If a new set of parameter values is available, it can be fed into the model and generate prediction of the response value for each case.

While the foregoing description has been with reference to particular embodiments of the present invention, it will be appreciated by those skilled in the art that changes in these embodiments may be made without departing from the principles and spirit of the invention, the scope of which is defined by the appended claims.

What is claimed is:

1. A yield management apparatus, comprising:
   means for receiving at least one case describing a semiconductor fabrication process, where a case comprises at least one prediction variable and at least one response variable corresponding to the at least one prediction variable;
   means for identifying, based at least in part on the at least one prediction variable, a number of times that a tool is used during the semiconductor fabrication process;
   means for producing at least one additional variable for the at least one case, the additional variable having a value equal to the identified number of times that the tool is used in the semiconductor fabrication process;
   means for generating a processed data set by adding the at least one additional variable to the at least one case;
   means for generating a model based on the processed data set,
   where the model describes the relationship between the at least one prediction variable, the at least one additional variable and the corresponding at least one response variable for the semiconductor fabrication process, the model is a decision tree, and the decision tree is tiered split using at least a first prediction variable of the at least one prediction variable;
   means for analyzing the generated model to identify at least one factor that affected a yield of the semiconductor fabrication process, where the at least one factor is identified out of the at least one prediction variable; and
   means for outputting the at least one factor that affected the yield of the semiconductor fabrication process.

2. The yield management apparatus of claim 1, where the receiving means is further for receiving an input data set comprising a plurality of cases describing the semiconductor fabrication process.

3. The yield management apparatus of claim 2, where the indentifying means and the producing means are used for each of the plurality of cases in the input data set and the generating means is configured to generate the model based on processed data sets for each of the plurality of cases in the input data set.

4. The yield management apparatus of claim 2, further comprising means for filtering out cases comprising outliers from the input data set.

5. The yield management apparatus of claim 2, where the plurality of cases describing the semiconductor fabrication process comprise at least one case missing at least one of the at least one prediction variable and at least one case comprising the at least one of the at least one prediction variable, further comprising means for filtering out the at least one case missing at least one of the at least one prediction variable.

6. The yield management apparatus of claim 1, further comprising means for adjusting at least one process step of the semiconductor fabrication process based at least in part on the generated model.

7. A yield management method, comprising:
   receiving at least one case describing a semiconductor fabrication process, where a case comprises at least one prediction variable and at least one response variable corresponding to the at least one prediction variable;
   identifying, based at least in part on the at least one prediction variable, a number of times that a tool is used during the semiconductor fabrication process;
   producing at least one additional variable for the at least one case, the additional variable having a value equal to the identified number of times that the tool is used in the semiconductor fabrication process;

generating, by a processor, a processed data set by adding the at least one additional variable to the at least one case;

generating a model based on the processed data set, where the model describes the relationship between the at least one prediction variable, the at least one additional variable and the corresponding at least one response variable for the semiconductor fabrication process, the model is a decision tree, and the decision tree is tiered split using at least a first prediction variable of the at least one prediction variable;

analyzing the generated model to identify at least one factor that affected a yield of the semiconductor fabrication process, where the at least one factor is identified out of the at least one prediction variable; and outputting the at least one factor that affected the yield of the semiconductor fabrication process.

8. The yield management method of claim 7, where receiving further comprises receiving an input data set comprising a plurality of cases describing the semiconductor fabrication process.

9. The yield management method of claim 8, where indentifying and producing are used for each of the plurality of cases in the input data set and generating generates the model based on processed data sets for each of the plurality of cases in the input data set.

10. The yield management method of claim 8, further comprising filtering out cases comprising outliers from the input data set.

11. The yield management method of claim 7, further comprising adjusting at least one process step of the semiconductor fabrication process based at least in part on the generated model.

12. The yield management method of claim 7, where indentifying and producing are repeated for each tool used in the semiconductor fabrication process.

13. A non-transitory computer readable memory tangibly encoded with a software application executable by a processing unit to perform actions comprising:

receiving at least one case describing a semiconductor fabrication process, where a case comprises at least one prediction variable and at least one response variable corresponding to the at least one prediction variable;

identifying, based at least in part on the at least one prediction variable, a number of times that a tool is used during the semiconductor fabrication process;

producing at least one additional variable for the at least one case, the additional variable having a value equal to the identified number of times that the tool is used in the semiconductor fabrication process;

generating, by a processor, a processed data set by adding the at least one additional variable to the at least one case;

generating a model based on the processed data set, where the model describes the relationship between the at least one prediction variable, the at least one additional variable and the corresponding at least one response variable for the semiconductor fabrication process, the model is a decision tree, and the decision tree is tiered split using at least a first prediction variable of the at least one prediction variable;

analyzing the generated model to identify at least one factor that affected a yield of the semiconductor fabrication process, where the at least one factor is identified out of the at least one prediction variable; and means for outputting the at least one factor that affected the yield of the semiconductor fabrication process.

14. The computer readable memory of claim 13, where receiving further comprises receiving an input data set comprising a plurality of cases describing the semiconductor fabrication process.

15. The computer readable memory of claim 14, where indentifying and producing are used for each of the plurality of cases in the input data set and generating generates the model based on processed data sets for each of the plurality of cases in the input data set.

16. The computer readable memory of claim 14, where the actions further comprise filtering out cases comprising outliers from the input data set.

17. The computer readable memory of claim 13, where the actions further comprise adjusting at least one process step of the semiconductor fabrication process based at least in part on the generated model.

18. The yield management apparatus of claim 1, where the number of times that a tool is used during the semiconductor fabrication process magnifies an impact of the tool on the yield of the semiconductor fabrication process.

19. The yield management apparatus of claim 1, where the yield of the semiconductor fabriction process describes a number of functional devices produced by the process as compared to a total number of devices produced.

20. The yield management apparatus of claim 1, where the at least one case comprises a variable which identifies a time when an associated tool was used.

* * * * *

UNITED STATES PATENT AND TRADEMARK OFFICE
CERTIFICATE OF CORRECTION

PATENT NO. : 8,380,472 B2  
APPLICATION NO. : 12/150676  
DATED : February 19, 2013  
INVENTOR(S) : Weidong Wang and Jonathan B. Buckheit It is certified that error appears in the above-identified patent and that said Letters Patent is hereby corrected as shown below:

In the Claims:

In column 22, line 37, "indentifying" should be deleted and -- identifying -- should be inserted.

In column 23, lines 22-23, "indentifying" should be deleted and -- identifying -- should be inserted.

In column 23, line 35, "indentifying" should be deleted and -- identifying -- should be inserted.

In column 24, line 25, "indentifying" should be deleted and -- identifying -- should be inserted.

Signed and Sealed this  
Seventh Day of May, 2013

Teresa Stanek Rea  
*Acting Director of the United States Patent and Trademark Office*